US009653471B2

(12) United States Patent
Chang et al.

(10) Patent No.: US 9,653,471 B2
(45) Date of Patent: May 16, 2017

(54) PATTERN LAYOUT TO PREVENT SPLIT GATE FLASH MEMORY CELL FAILURE

(71) Applicant: Taiwan Semiconductor Manufacturing Co., Ltd., Hsin-Chu (TW)

(72) Inventors: Yu-Hsing Chang, Taipei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/143,811

(22) Filed: May 2, 2016

(65) Prior Publication Data

US 2016/0247812 A1 Aug. 25, 2016

Related U.S. Application Data

(62) Division of application No. 14/310,277, filed on Jun. 20, 2014, now Pat. No. 9,356,142.

(51) Int. Cl.
*H01L 27/115* (2006.01)
*H01L 27/11568* (2017.01)
(Continued)

(52) U.S. Cl.
CPC .. *H01L 27/11568* (2013.01); *H01L 21/28282* (2013.01); *H01L 27/1157* (2013.01);
(Continued)

(58) Field of Classification Search
CPC .............. H01L 27/11568; H01L 21/28282
See application file for complete search history.

(56) References Cited

U.S. PATENT DOCUMENTS

2004/0170843 A1 9/2004 Moritani et al.
2014/0264534 A1* 9/2014 Tsair ................ H01L 27/11517
257/316

(Continued)

OTHER PUBLICATIONS

Notice of Allowance dated Jan. 29, 2016 for U.S. Appl. No. 14/310,277.

*Primary Examiner* — Dung Le
(74) *Attorney, Agent, or Firm* — Eschweiler & Potashnik, LLC

(57) ABSTRACT

A semiconductor structure of a split gate flash memory cell is provided. The semiconductor structure includes a semiconductor substrate including a first source/drain region and a second source/drain region. The first and second source/drain regions form a channel region therebetween. The semiconductor structure further includes a select gate and a memory gate spaced between the first and second source/drain regions over the channel region. The select gate extends over the channel region and terminates at a line end having a top surface asymmetric about an axis that extends along a length of the select gate and that bisects a width of the select gate. Even more, the semiconductor structure includes a charge trapping dielectric arranged between neighboring sidewalls of the memory gate and the select gate, and arranged under the memory gate. A method of manufacturing the semiconductor structure is also provided.

20 Claims, 18 Drawing Sheets

(51) Int. Cl.
*H01L 29/78* (2006.01)
*H01L 29/792* (2006.01)
*H01L 29/66* (2006.01)
*H01L 29/423* (2006.01)
*H01L 27/1157* (2017.01)
*H01L 21/28* (2006.01)
*H01L 29/08* (2006.01)

(52) U.S. Cl.
CPC .... *H01L 29/0847* (2013.01); *H01L 29/42344* (2013.01); *H01L 29/66484* (2013.01); *H01L 29/66833* (2013.01); *H01L 29/7831* (2013.01); *H01L 29/792* (2013.01)

(56) References Cited

U.S. PATENT DOCUMENTS

2015/0021679 A1* 1/2015 Tsair ................... H01L 29/788
 257/320
2015/0206891 A1 7/2015 Chuang et al.

* cited by examiner

PATTERN LAYOUT TO PREVENT SPLIT GATE FLASH MEMORY CELL FAILURE

REFERENCE TO RELATED APPLICATION

This application is a Divisional of U.S. application Ser. No. 14/310,277, filed on Jun. 20, 2014, the contents of which are incorporated herein by reference in their entirety.

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells. Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
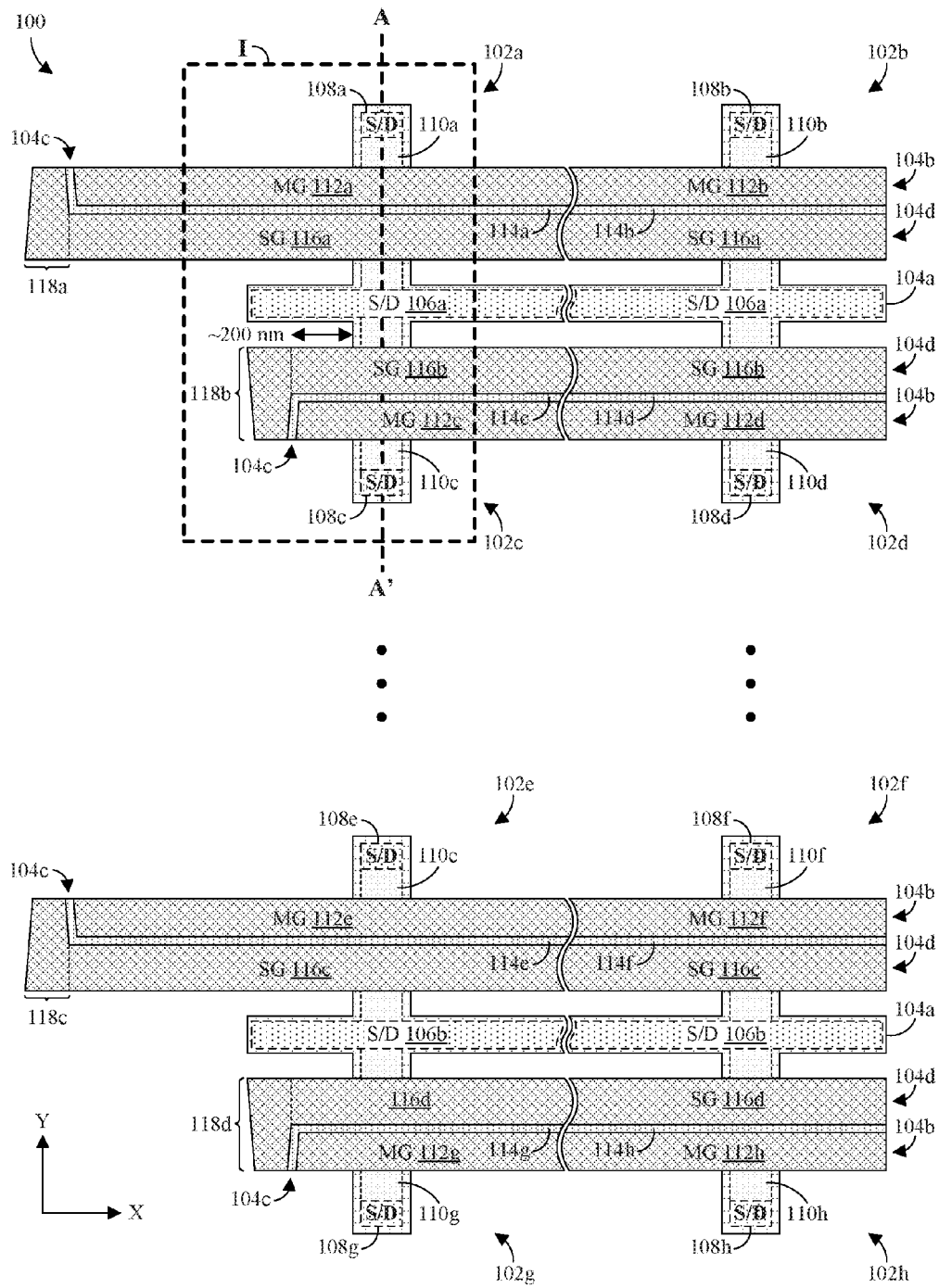
FIG. 1 illustrates a top view of several layers included in some embodiments of a semiconductor structure of an array of split gate flash memory cells, the semiconductor structure employing asymmetric select gate line ends.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Common types of split gate flash memory cells include the so called silicon-oxide-nitride-oxide-silicon (SONOS) split gate flash memory cell and the so called metal-oxide-nitride-oxide-silicon (MONOS) split gate flash memory cell. The semiconductor structure of a SONOS or MONOS split gate flash memory cell includes a memory gate and a select gate spaced over a top surface of a semiconductor substrate between a source region and a drain region embedded in the top surface of the semiconductor substrate. For a SONOS split gate flash memory cell, the memory gate is formed from a silicon based material, such as polysilicon, and for a MONOS split gate flash memory cell, the memory gate is formed from a metal or metal alloy. Arranged between neighboring sidewalls of the memory gate and the select gate, and extending under the memory gate between the semiconductor substrate and the memory gate, the semiconductor structure includes a charge trapping dielectric. The charge trapping dielectric stores a variable amount of charge corresponding to a stored value. Through selective biasing of the memory gate and the select gate, the amount of stored charge and the value can be varied.

MONOS or SONOS split gate flash memory cells are typically formed in an array of columns and rows. The split gate flash memory cells of a row share a common a select gate that extends linearly across all of the split gate flash memory cells of the row and terminates or ends at the peripheral of the array. The select gate of a row typically has a uniform width and a symmetric, semicircle shaped line end. Further, the select gate of a row typically has a line end spaced from the channel region under the nearest split gate flash memory cell of the row.

According to some methods to forming the semiconductor structure for an array of MONOS or SONOS split gate flash memory cells, neighboring rows are formed in pairs. A pair of select gates corresponding to neighboring rows of a pair is formed spaced over a semiconductor substrate with symmetric, semicircle shaped line ends. A first, charge trapping dielectric layer is then conformally formed over the select gates and the semiconductor substrate. Further, memory gates corresponding to the individual split gate flash memory cells of the neighboring rows are formed over and laterally abutting the charge trapping dielectric layer outside a central region between the select gates. In forming the memory gates, a conductive layer and a second dielectric layer are conformally formed over the select gates and the charge trapping dielectric layer. The conductive layer and the second dielectric layer are then etched. After forming the memory gates, the memory gates are sealed by a third dielectric layer and remaining portions of the conductive layer and the second and third dielectric layers in the central region are removed by chemical dry etching (CDE).

A challenge posed by the foregoing methods to forming the semiconductor structure for an array of MONOS or SONOS split gate flash memory cells stems from the use of CDE for the removal of remaining portions of the conductive layer and the second and third dielectric layers in the central region. CDE is an isotropic etching process. Therefore, during the removal, CDE laterally etches the remaining portions of the conductive layer and the second and third dielectric layers around the periphery of the select gate line ends into the memory gates and towards the channel regions of the nearest split gate flash memory cells. To completely remove remaining portions of the conductive layer and the second and third dielectric layers in the central region, the CDE may etch into regions of the memory gates overlaying channel regions, which may cause failure of the corresponding split gate flash memory cells. This challenge is exacerbated in 28 nanometer (nm) micro fabrications.

Another challenge posed by the foregoing methods to forming the semiconductor structure for an array of MONOS or SONOS split gate flash memory cells stems from the small size of the select gate line ends. Because of the uniform width of the select gates, and the symmetrical, semicircle shaped line ends of the select gates, the line ends typically have a small top surface area to which contacts are overlaid. This introduces difficulty into the manufacture of the array, especially during 28 nm micro fabrications. The memory gates and the select gates are so close that it's easy to short the two. Further, conductive contacts extending vertical down to the line ends may fail to land on the line ends due to, for example, overlay shift, thereby resulting in select gate contact opens.

In view of the foregoing, the present disclosure is directed to an improved select gate line end that addresses the foregoing challenges. The line end is increased in size and asymmetric. The line end can be circular, triangular or shaped according to any irregular form. By increasing the size of the line end and changing to an asymmetric line end, the buffer between the channel region and the central region is increased (i.e., the path of the CDE to the channel region is increased in length). Further, the amount of top surface area to which contacts are overlaid is increased. Thus, the improved select gate lines ends with increases top surface area limit or prevent shorting between the select gate and its neighboring memory gate. The present disclosure is further directed to a method of forming a semiconductor structure for an array of MONOS or SONOS split gate flash memory cells with asymmetric select gate line ends. The method is suitable for 28 nm micro fabrications.

With reference to FIG. 1, a top view 100 of some embodiments of a semiconductor structure of an array of split gate flash memory cells 102a-h is provided. The split gate flash memory cells 102 can, for example, be MONOS or SONOS split gate flash memory cells. The top view 100 illustrates the layout of the array and includes several layers 104a-d, but not all layers, included in the semiconductor structure of the array. For illustrative purposes, the array includes 2 columns and 4 rows of split gate flash memory cells 102, but it is to be understood that more or less columns and/or more or less rows are amenable. The array need only include a single row and a single column. In some embodiments, the rows are formed in pairs of neighboring rows. The pairs are, for example, separated by about 150 nm.

The layers 104 include an active (or oxide diffusion) layer 104a. The active layer 104a includes source/drain regions 106a, 106b, 108a-h forming channel regions 110a-h individual to the split gate flash memory cells 102. In some embodiments, the source/drain regions 106, 108 include source/drain regions 106 individual to pairs of neighboring rows and hence shared by the neighboring rows of corresponding pairs. The shared sourced/drain regions 106 are, for example, drain regions and/or connected to ground. Further, in some embodiments, the source/drain regions 106, 108 include source/drain regions 108 individual to the split gate flash memory cells 102. The individual source/drain regions 108 are, for example, source regions and/or connected to corresponding source lines.

The layers 104 further include a memory gate layer 104b that includes memory gates 112a-h of the split gate flash memory cells 102 of the array, a charge trapping dielectric layer 104c that includes charge trapping dielectrics 114a-h of the split gate flash memory cells 102, and a select gate layer 104d that includes select gates 116a-d of the split gate flash memory cells 102 of the array. The memory gates 112 are individual to the split gate flash memory cells 102 and connected to bit lines of corresponding columns. Alternatively, the memory gates 112 are individual to the columns and hence shared by the split gate flash memory cells 102 of corresponding columns. Where shared, the memory gates 112 correspond to the bit lines. The charge trapping dielectrics 114 are individual to the split gate flash memory cells 102 and store variable amounts of charge corresponding to stored values. The select gates 116 are individual to the split gate flash memory cells 102 and connected to word lines of corresponding columns. Alternatively, the select gates 116 are individual to the rows and hence shared by the split gate flash memory cells 102 of corresponding rows. Where shared, the select gates 116 correspond to the word lines. In some embodiments, select gates 116 neighboring in different rows and sharing a source/drain region 106 are, for example, separated by about 110 nm.

The select gates 116 extend over corresponding split gate flash memory cells 102 and terminate or end at the periphery of the corresponding split gate flash memory cells 102 with corresponding line ends 118a-d. For example, where the select gates 116 are individual to rows, the select gates 116 extend linearly across the corresponding rows (e.g., in the X direction) and terminate or end at the periphery of the array with corresponding line ends 118. While extending over the corresponding split gate flash memory cells 102, the select gates 116 include corresponding, generally uniform widths, such as about 70 nm. At the periphery of the corresponding split gate flash memory cells 102, the select gates 116 include corresponding widths varying, and ultimately increasing, relative to the corresponding, generally uniform widths. The line ends 118 of the select gates 116 correspond to these regions of varying width. In some embodiments, the line end 118 of a select gate 116 is spaced about 100-200 nm, typically about 200 nm, from the channel region 110 of the nearest split gate flash memory cell 102, whereas the line end 118 of a neighboring select gate 116 in the same column is spaced farther from the channel region 110 of the nearest split gate flash memory cell 102. These two select gates 116 correspond to, for example, neighboring split gate flash memory cells 102 in different rows that share a source/drain region 106.

When projected to the X-Y plane, the line end 118 of a select gate 116 is asymmetric about an axis running along the length of the select gate 116 (e.g., in the X direction) and bisecting the generally uniform width. The projection of the line end 118 can have any shape, such as a circular, rectangular, triangular, or trapezoidal shape. In some embodiments, the line end 118 does not protrude towards a source/drain region 106 (e.g., a drain region) shared by a pair of split gate flash memory cells 102 to which the line end 118 corresponds. Further, in some embodiments, the maximum width of the line end 118 is about 70-160 nm, and/or the maximum length of the line end 118 is about 50-150 nm (e.g., 90 nm).

Advantageously, the asymmetric line end 118 provides increased top surface area relative to other line ends. This increased surface area advantageously increases the ease with which contacts are connected to the line end 118 and reduces the likelihood of shorting memory gates 112 and select gates 116. Further, the increased surface area advantageously reduces the likelihood of conductive contacts failing to land on the line end 118 due to, for example, overlay shift. This, in turn, reduces the likelihood of select gate contact opens. Moreover, the asymmetric line end 118 advantageously increases the buffer or distance from a central region between a pair of select gates 116 to the memory gates 112. As discussed hereafter, this reduces to the likelihood of manufacturing defects and/or failure of the split gate flash memory cells 102.

Figure 2A:
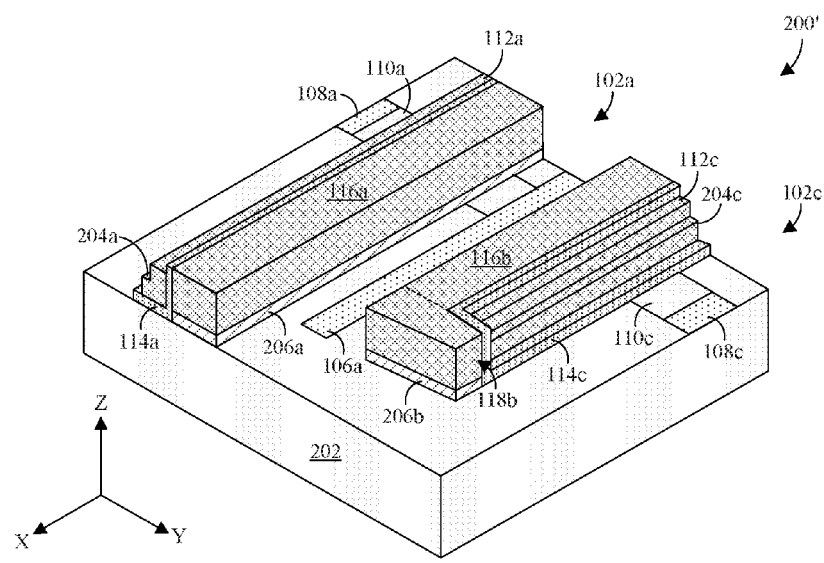
FIG. 2A illustrates a perspective view of some embodiments of the semiconductor structure within box I of FIG. 1.

With reference to FIG. 2A, a perspective view 200' of some embodiments of the semiconductor structure within box I of FIG. 1 is provided. The perspective view 200 illustrates a specific pair of split gate flash memory cells 102a, 102c of the array, as well as a specific split gate line end 118b for the pair. However, it is to be understood that the perspective view 200' is illustrative of other pairs of split gate flash memory cells 102 of the array and other split gate line ends 118 of the array. Note in FIG. 2A that several structures, including the central and peripheral sidewall structures (discussed hereafter), are not included for ease of illustration and to show part of the channel region 110.

The semiconductor structure includes a semiconductor substrate 202 over which, and/or within which, the split gate flash memory cells 102 are formed. The semiconductor substrate 202 is n- or p-type, and can, for example, be a bulk silicon substrate or a silicon-on-insulator (SOI) substrate. If present, an SOI substrate is often made up of an active layer of high quality silicon in which the split gate flash memory cells 102 are formed. In such instances, the split gate flash memory cells 102 are arranged over a buried layer (BOX) of electrically insulating silicon dioxide, which is arranged over a bulk silicon support substrate. Typically, the semiconductor substrate 202 is planar with a uniform thickness.

Embedded within the top surface of the semiconductor substrate 202, the semiconductor structure includes a source/drain region 106a shared by the split gate flash memory cells 102 and two source/drain regions 108a, 108c individual to the split gate flash memory cells 102. The shared and individual source/drain regions 106, 108 may be of the same type (i.e., n- or p-type) and of the opposite type as the semiconductor substrate 202. Alternatively, the shared and individual source/drain regions 106, 108 may be of opposite type as a well region or active region in which the split gate flash memory cells 102 are formed. Further, the shared and individual source/drain regions 106, 108 are spaced over the top surface to define a channel region 110a, 110c between each individual source/drain region 108 and the shared source/drain region 106. The channel regions 110 correspond to the different split gate flash memory cells 102 of the pair.

Over each channel region 110, the semiconductor structure includes a select gate 116a, 116b and a memory gate 112a, 112c spaced between the shared source/drain region 106 and the individual source/drain region 108 of the channel region 110. The select gate 116 is arranged proximate to the shared source/drain region 106, and the memory gate 112 is arranged proximate to the individual source/drain region 108. In some embodiments, the select gates 116 are spaced from each other by about 110 nm.

Each select gate 116 of the pair extends over the channel region 110 and terminates or ends with a line end 118b. In some embodiments, the line end 118 is spaced about 100-200 nm, typically about 200 nm, from the channel region 110, and/or has a length of about 50-150 nm, typically about 90 nm. While extending over the channel region 110 to the line end 118, the select gate 116 includes a generally uniform width, such as about 70 nm. At the line end 118, the select gate 116 includes a width varying relative to the generally uniform width. In some embodiments, the varying width increases to 70-160 nm. The projection of the line end 118 to the top surface of the semiconductor substrate 202 (e.g., the X-Y plane) is asymmetric about an axis that runs along the length of the select gate 116 (e.g., in the X direction) and that bisects the generally uniform width. The projection can have any shape, such as a circular, rectangular, triangular, or trapezoidal shape. In some embodiments, the line end 118 does not protrude towards the shared source/drain region 106.

Each memory gate 112 has, in some embodiments, a generally asymmetrical, stepped profile and is recessed proximate to the individual source/drain region 108 to define a ledge 204a, 204c. The ledge 204 exhibits a reduced height relative to a top surface of the memory gate 112 and runs along an edge facing the individual source/drain region 108.

Arranged between the semiconductor substrate 202 and the select gate 116, a gate dielectric 206a, 206b electrically isolates the select gate 116 from the semiconductor substrate 202. Further, arranged between the semiconductor substrate 202 and the memory gate 112, a charge trapping dielectric 114a, 114c electrically isolates the memory gate 112 from the semiconductor substrate 202. The charge trapping dielectric 114 further extends vertically up to fill the space between the memory gate 112 and the select gate 116 and to electrically isolate the memory gate 112 from the select gate 116. In some embodiments, the charge trapping dielectric 114 extends vertically up to approximately even with the top surface of the select gate 116. The gate dielectric 206 is, for example, an oxide, such as silicon dioxide, and the charge trapping dielectric 114 is, for example, a multilayer dielectric, such as an oxide-nitride-oxide (ONO) dielectric or an oxide-silicon dot-oxide (OSiO) dielectric.

Figure 2B:
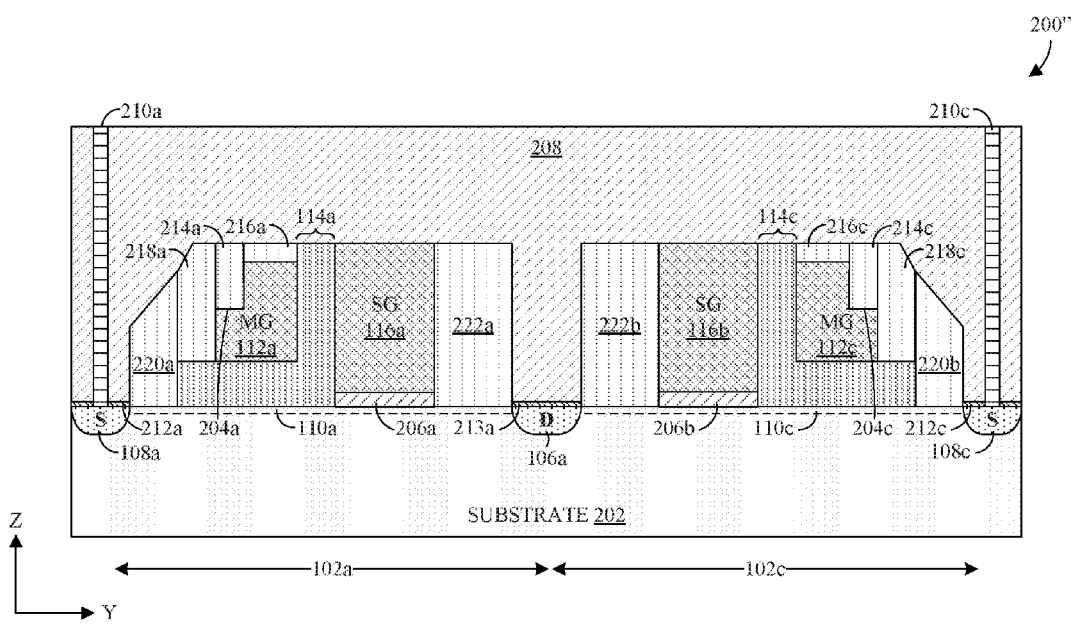
FIG. 2B illustrates a cross sectional view of some embodiments of the semiconductor structure along line A-A' of FIG. 1.

With reference to FIG. 2B, a cross sectional view 200" of some embodiments of the semiconductor structure along line A-A' of FIG. 1 is provided. The cross sectional view 200" illustrates a specific pair of split gate flash memory cells 102a, 102c of the array. However, it is to be understood that the perspective view 200' is illustrative of other pairs of split gate flash memory cells 102 of the array.

The semiconductor structure includes a semiconductor substrate 202 over which, and/or in which, the split gate flash memory cells 102 are formed and an interlayer dielectric 208 encapsulating or otherwise surrounding the split gate flash memory cells 102. The interlayer dielectric 208 is, for example, silicon dioxide. The semiconductor substrate 202 is, for example, a bulk silicon substrate or a SOI substrate in which the split gate flash memory cells 102 are formed. Embedded within the top surface of the semiconductor substrate 202, the semiconductor structure includes a source/drain region 106a shared by the split gate flash memory cells 102 and two source/drain regions 108a, 108c individual to the split gate flash memory cells 102. The shared and individual source/drain regions 106, 108 are spaced over the top surface to define a channel region 110a, 110c between each individual source/drain region 108 and the shared source/drain region 106.

Conductive contacts 210a, 210c individual to the split gate flash memory cells 102 extend vertically down through the interlayer dielectric 208 to contact pads 212a, 212c individual to the split gate flash memory cells 102 and arranged over the individual source/drain regions 108. Further, a conductive contact (not shown) shared by the split gate flash memory cells 102 extends vertically down through the interlayer dielectric 208 to a contact pad 213a shared by the split gate flash memory cells 102 and arranged over the shared source/drain region 106. The contact pads 212, 213 are typically silicide, such as, for example, nickel silicide. Further, the conductive contacts 210 are, for example, be formed of one or more of titanium, titanium nitride, and tungsten.

Over each channel region 110, the semiconductor structure includes a select gate 116a, 116b and a memory gate 112a, 112c spaced between the shared source/drain region 106 and the individual source/drain region 108 of the channel region 110. The select gate 116 typically has a generally rectangular profile. The memory gate 112 typically has a generally asymmetrical, stepped profile and is recessed proximate to the individual source/drain region 108 to define a ledge 204a, 204c.

A spacer 214a, 214c extends vertically up from the memory gate ledge 204, along and abutting an upper, inner sidewall of the memory gate 112, to cover the upper sidewall of the memory gate 112. In some embodiments, the spacer 214 extends vertically up to approximately even with the top surface of the select gate 116. A top sealer 216a, 216c is arranged to cover the top surface of the memory gate 112. In some embodiments, the top sealer 216 includes a top surface approximately coplanar with the top surface of the select gate 116. Further, in some embodiments, the top sealer 216 extends over the top surface of the memory gate 112 from the spacers 214. A side sealer 218a, 218c is arranged to cover a lower, outer sidewall of the memory gate 112 proximate to the individual source/drain region 108. In some embodiments, the side sealer 218 extends vertically up from approximately even with a bottom surface of the memory gate 112, along and abutting sidewalls of the memory gate 112 and the spacer 214, to approximately even with the top surface of the select gate 116. The top and side sealers 216, 218, as well as the spacer 214, are typically dielectrics, such as silicon nitride.

Arranged between the semiconductor substrate 202 and the select gate 116, a gate dielectric 206a, 206b electrically isolates the select gate 116 from the semiconductor substrate 202. Arranged between the semiconductor substrate 202 and the memory gate 112, a charge trapping dielectric 114a, 114c electrically isolates the memory gate 112 from the semiconductor substrate 202. The charge trapping dielectric 114 further extends vertically up to fill the space between the memory gate 112 and the select gate 116 and to electrically isolate the memory gate 112 from the select gate 116. In some embodiments, the charge trapping dielectric 114 extends between the side sealer 218 and the semiconductor substrate 202, and/or between the top sealer 216 and the select gate 116. The gate dielectric 206 is, for example, an oxide, such as silicon dioxide, and the charge trapping dielectric 114 is, for example, a multilayer dielectric, such as an oxide-nitride-oxide (ONO) dielectric or an oxide-silicon dot-oxide (OSiO) dielectric.

A peripheral sidewall structure 220a, 220b extends from the semiconductor substrate 202, along and abutting sidewalls of the charge trapping dielectric 114 and the side sealer 218, to cover the sidewalls of the charge trapping dielectric 114 and the side sealer 218. Further, a central sidewall structure 222a, 222b extends from the semiconductor substrate 202, along and abutting sidewalls of the gate dielectric 206 and the select gate 116, to cover the sidewalls of the gate dielectric 206 and the select gate 116. In some embodiments, the central sidewall structure 222 extends to approximately even with the top surface of the select gate 116. The peripheral and central sidewall structures 220, 222 are, for example, dielectrics, such as silicon nitride.

In operation, each split gate flash memory cells 102 stores a variable amount of charge, such as electrons, in the charge trapping dielectric 114. The charge is advantageously stored in a non-volatile manner so that the stored charge persists in the absence of power. The amount of charge stored in the charge trapping dielectric 114 represents a value, such as binary value, and is varied through program (i.e., write), read, and erase operations. These operations are performed through selective biasing of the select gate 116 and the memory gate 112.

During a program operation of a split gate flash memory cell 102, the memory gate 112 is forward biased with a high (e.g., at least an order of magnitude higher) voltage relative a voltage applied across the channel region 110 and/or relative to a voltage applied to the select gate 116. The high, forward bias voltage promotes Fowler-Nordheim tunneling of carriers from the channel region 110 towards the memory gate 112. As the carriers tunnel towards the memory gate 112, the carriers become trapped in the charge trapping dielectric 114.

During an erase operation of a split gate flash memory cell 102, the memory gate 112 is reverse biased with a high (e.g., at least an order of magnitude higher) voltage relative a voltage applied across the channel region 110 and/or relative to a voltage applied to the select gate 116. The high, reverse bias voltage Fowler-Nordheim tunneling of carriers in the charge trapping dielectric 114 away from the memory gate 112. As the carriers tunnel away from the memory gate 112, the carriers become dislodged or otherwise removed from the charge trapping dielectric 114.

Charge stored in the charge trapping dielectric 114 of a split gate flash memory cell 102 screens an electric field formed between the memory gate 112 and the channel region 110 when the memory gate 112 is biased. This has an effect of increasing the threshold voltage $V_{th}$ of the split gate flash memory cell 102 by an amount $\Delta V_{th}$. During a read operation, a voltage is applied to the select gate 116 to induce part of the channel region 110 to conduct. Application of a voltage to the select gate 116 attracts carriers to part of the channel region 110 adjacent to the select gate 116. Further, a voltage greater than $V_{th}$, but less than $V_{th}+\Delta V_{th}$, is applied to the memory gate 112. If the split gate flash memory cell 102 turns on (i.e., allows charge to flow), then it stores a first data state (e.g., a logical "0"). If the split gate flash memory cell 102 does not turn on, then it stores a second data state (e.g., a logical "1").

Figure 3:
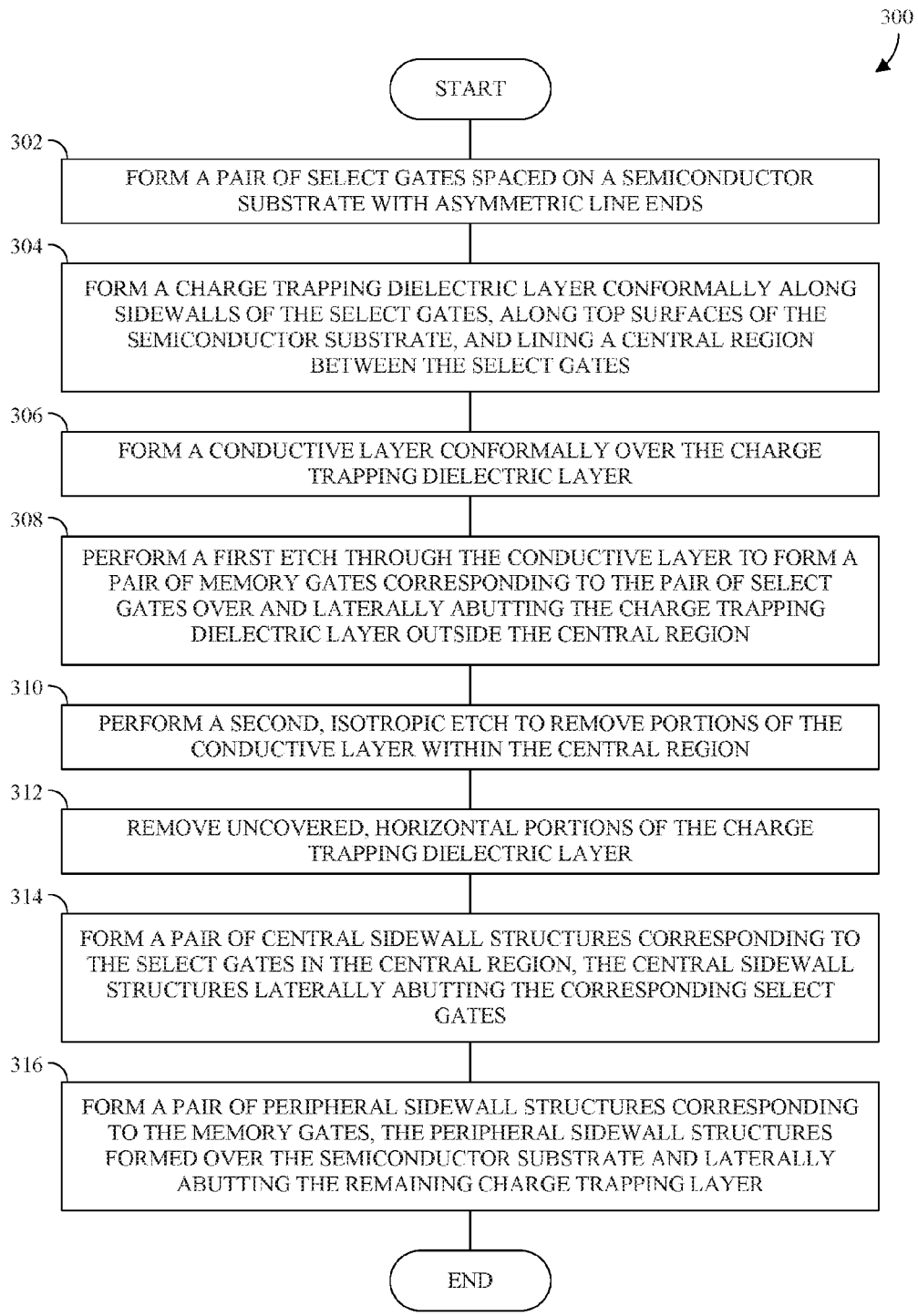
FIG. 3 illustrates a flow chart of some embodiments of a method of manufacturing a semiconductor structure for a pair of split gate flash memory cells, the semiconductor structure employing asymmetric select gate line ends.

With reference to FIG. 3, a flow chart 300 of some embodiments of a method for manufacturing the semiconductor structure is provided. According to the method, a pair of select gates spaced on a semiconductor substrate is formed (Action 302). The select gates extend linearly in parallel with generally uniform widths and terminate at asymmetric line ends with increased widths. A line end of a select gate is asymmetric about an axis that runs along the length of the select gate and that bisects the generally uniform width of the select gate. Further, the line end extends away from a central region between the select gates. In some embodiments, the line end has a width of about 70-160 nm and/or a length of 50-150 nm (e.g., 90 nm). Further, in some embodiments, the projection of the line end onto the top surface of the semiconductor substrate is circular, triangular, rectangular, or trapezoidal.

A charge trapping dielectric layer is formed (Action 304) conformally along sidewalls of the select gates, along top surfaces of the semiconductor substrate, and lining the central region between the select gates. A conductive layer is conformally formed (Action 306) over the charge trapping dielectric layer. An first etch through the conductive layer is performed (Action 308) to form a pair of memory gates corresponding to the pair of select gates over and laterally abutting the charge trapping dielectric layer outside the central region. The remaining conductive layer extends continuously along the central region, around the line ends of the select gates, and along the other sides of the select gates. A second, isotropic etch is performed (Action 310) to remove portions of the conductive layer within the central region. The second etch is, for example, a CDE. Because the second etch is isotropic, the second etch etches laterally. Depending upon the duration of the second etch, the second etch etches laterally from the central region, around the periphery of the select gate line ends, and into to the memory gates. In a sense, the select gate line ends serve as buffers between the central region and the memory gates during the second etch. The larger the periphery of the select gate a select gate line end, the larger the buffer. If the second etch reaches the channel region of a memory gate, the memory gate and the corresponding split gate flash memory cell can fail. Therefore, the asymmetric shape and the increased size of the select gate line ends relative to other select gate line ends advantageously increases the buffer and advantageously reduces the likelihood of failure.

With the portions of the conductive layer in the central region removed, uncovered, horizontal portions of the charge trapping dielectric layer are removed (Action 312), while leaving portions of the charge trapping dielectric layer arranged between neighboring sidewalls of the select gates and the memory gates and arranged between the semiconductor substrate and the memory gates. A pair of central sidewall structures corresponding to the select gates are formed (Action 314) in the central region. The central sidewall structures are formed over the semiconductor substrate and laterally abutting the corresponding select gates. A pair of peripheral sidewall structures corresponding to the memory gates are formed (Action 316). The peripheral sidewall structures are formed over the semiconductor substrate and laterally abutting the remaining charge trapping dielectric layer.

Figure 4A:
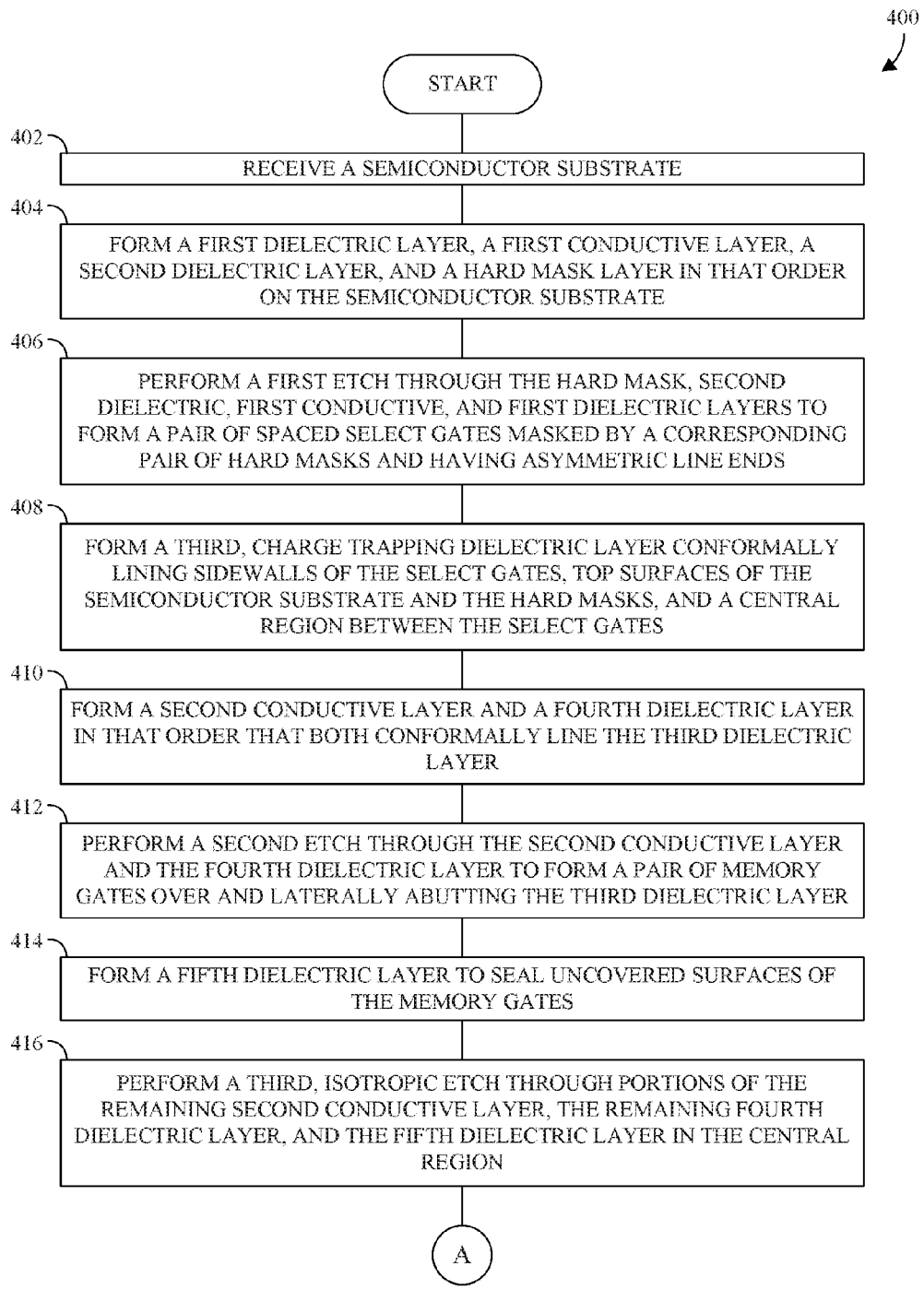
FIGS. 4A & B illustrate flow charts of some embodiments of a method of manufacturing a semiconductor structure for a pair of split gate flash memory cells, the semiconductor structure employing asymmetric select gate line ends.
Figure 4B:
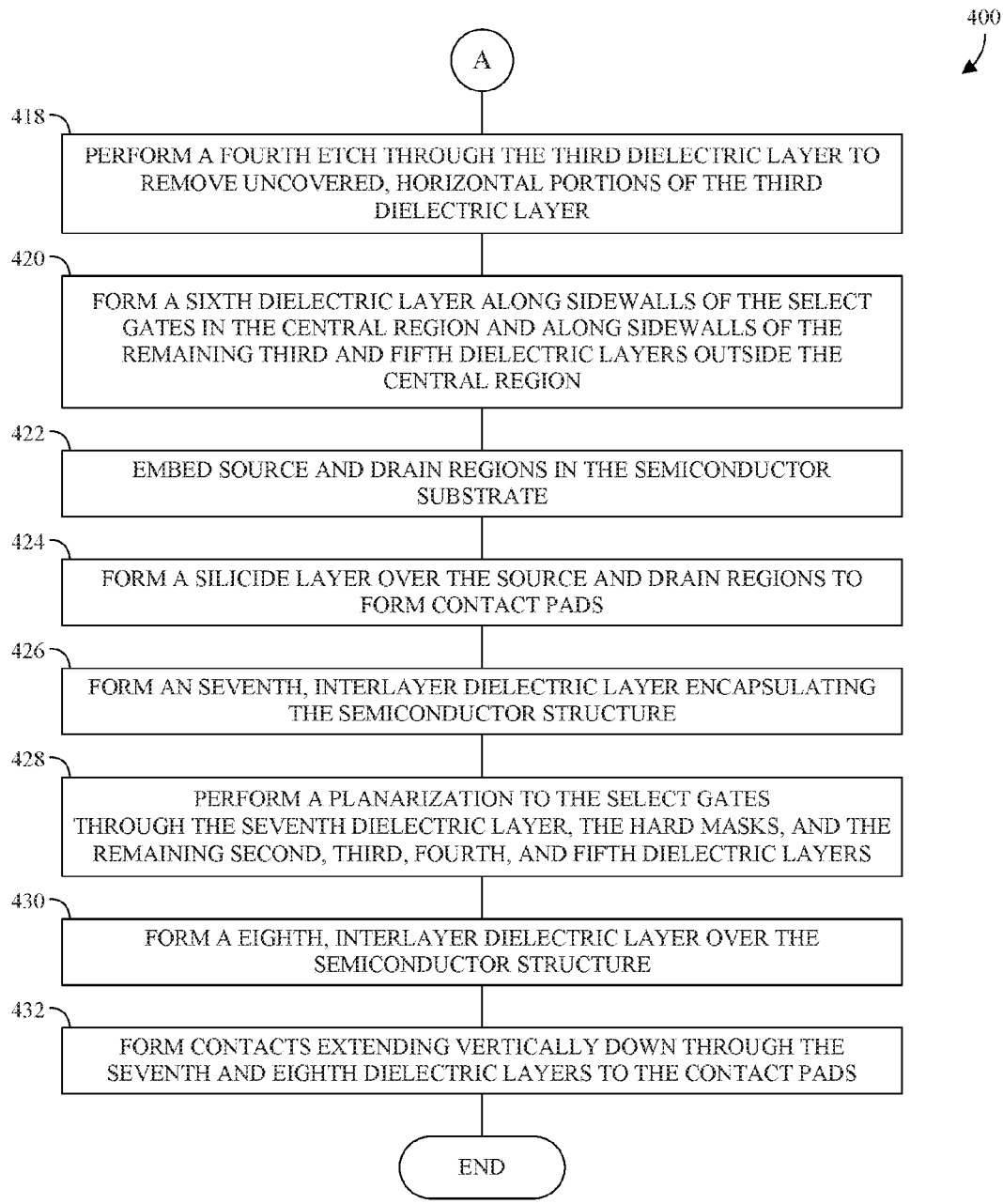

With reference to FIG. 4, a flow chart 400 of some embodiments of an expanded method for manufacturing the semiconductor structure is provided. According to the method, a semiconductor substrate is received (Action 402). A first dielectric layer, a first conductive layer, a second dielectric layer, and a hard mask layer are formed (Action 404) in that order on the semiconductor substrate. A first etch is performed (Action 406) through the hard mask, second dielectric, first conductive, and first dielectric layers to form a pair of spaced select gates masked by a corresponding pair of hard masks and having asymmetric line ends. The select gates extend linearly in parallel with generally uniform widths and terminate at asymmetric line ends with increased widths. A line end is asymmetric about an axis that runs along the length of the select gate and that bisects the generally uniform width of the select gate. Further, the line end extends away from a central region between the select gates.

A third, charge trapping dielectric layer is formed (Action 408) that conformally lines sidewalls of the select gates, top surfaces of the semiconductor substrate and the hard masks, and the central region. A second conductive layer and a fourth dielectric layer are formed (Action 410) in that order that both conformally line the third dielectric layer. A second etch is performed (Action 412) through the third conductive layer and the fifth dielectric layer to form a pair of memory gates over and laterally abutting the third dielectric layer. A fifth dielectric layer is formed (Action 414) to seal uncovered surfaces of the memory gates. A third, isotropic etch is performed (Action 416) through portions of the remaining second conductive layer, the remaining fourth dielectric layer, and the fifth dielectric layer in the central region to remove these portions from the central region. The third etch is, for example, a CDE. The asymmetric shape and the increased size of the line ends relative to other line ends advantageously acts as a buffer between the central region and the memory gates during the third etch and advantageously reduces the likelihood of damage to the memory gates and the corresponding split gate flash memory cells.

A fourth etch is performed (Action 418) through the third dielectric layer to remove uncovered, horizontal portions of the third dielectric layer, while leaving portions of the third dielectric layer arranged between neighboring sidewalls of the select gates and the memory gates and arranged between the semiconductor substrate and the memory gates. A sixth dielectric layer is formed (Action 420) along sidewalls of the select gates in the central region and along sidewalls of the remaining third dielectric layer and the fifth dielectric layer outside the central region. Source and drain regions are embedded (Action 422) in the semiconductor substrate, and a silicide layer is formed (Action 424) over the source and drain regions to form contact pads. A seventh, interlayer dielectric layer encapsulating the semiconductor structure is formed (Action 426), and a planarization is performed (Action 428) to the select gates. An eighth, interlayer dielectric layer is formed (Action 430) over the semiconductor structure, and contacts are formed (Action 432) extending vertically down through the seventh and eighth dielectric layers to the contact pads.

While the disclosed methods (e.g., the methods described by the flowchart 300 and 400) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 2B and 5-17, top and cross section views of some embodiments of the semiconductor structure at various stages of manufacture are provided to illustrate the expanded method. Figures with a suffix of "A" correspond to top views of the semiconductor structure within box I of FIG. 1, and Figures with a suffix of "B" correspond to cross sectional views of the semiconductor structure along line A-A' of FIG. 1. Although FIGS. 2B and 5-17 are described in relation to the expanded method, it will be appreciated that the structures disclosed in FIGS. 2B and 5-17 are not limited to the expanded method, but instead may stand alone as structures independent of the expanded method. Similarly, although the expanded method is described in relation to FIGS. 2B and 5-17, it will be appreciated that the expanded method is not limited to the structures disclosed in FIGS. 2B and 5-17, but instead may stand alone independent of the structures disclosed in FIGS. 2B and 5-17.

Figure 5A:
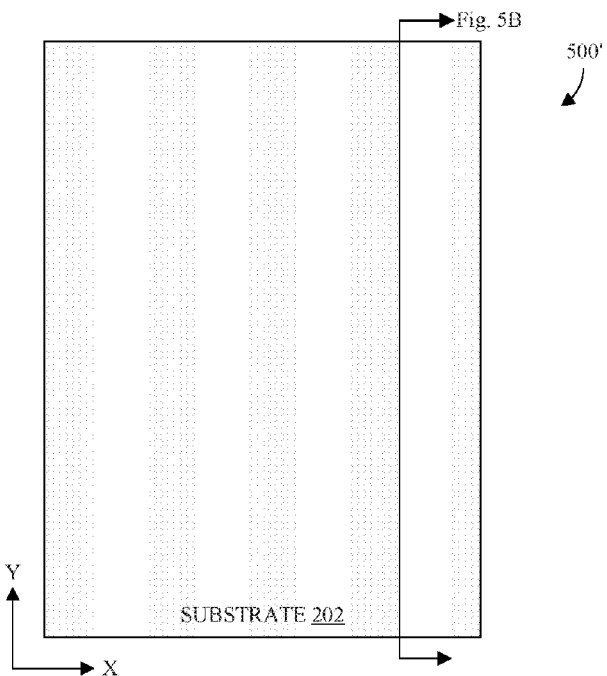
FIGS. 5A-17B illustrate a series of cross-sectional views of some embodiments of a semiconductor structure at various stages of manufacture for a pair of split gate flash memory cells, the semiconductor structure employing asymmetric select gate line ends.
Figure 5B:
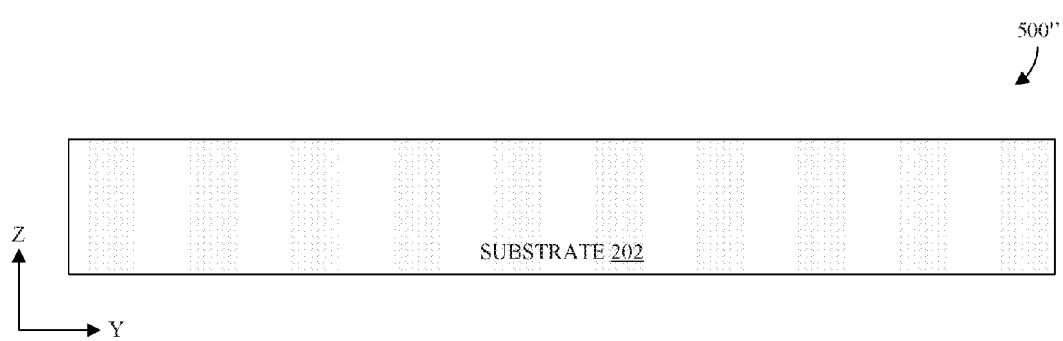

FIGS. 5A & B illustrate top and cross sectional views 500', 500", respectively, of some embodiments corresponding to Action 402. As shown by FIGS. 5A & B, a semiconductor substrate 202 is received. The semiconductor substrate 202 is typically planar with a uniform thickness. Further, the semiconductor substrate 202 can be a bulk silicon wafer, or a SOI substrate. As to the latter, the split gate flash memory cells 102 are arranged over a BOX of electrically insulating silicon dioxide, which is arranged over a bulk silicon support substrate, sometimes referred to as a handle wafer.

Figure 6A:
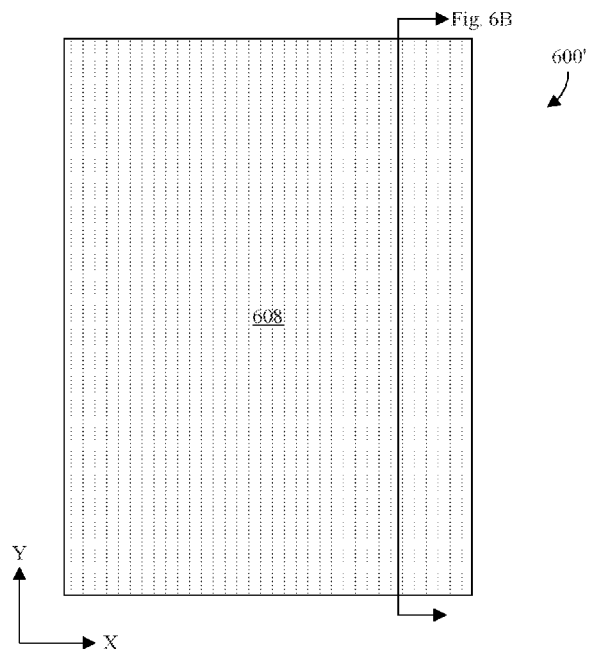
Figure 6B:
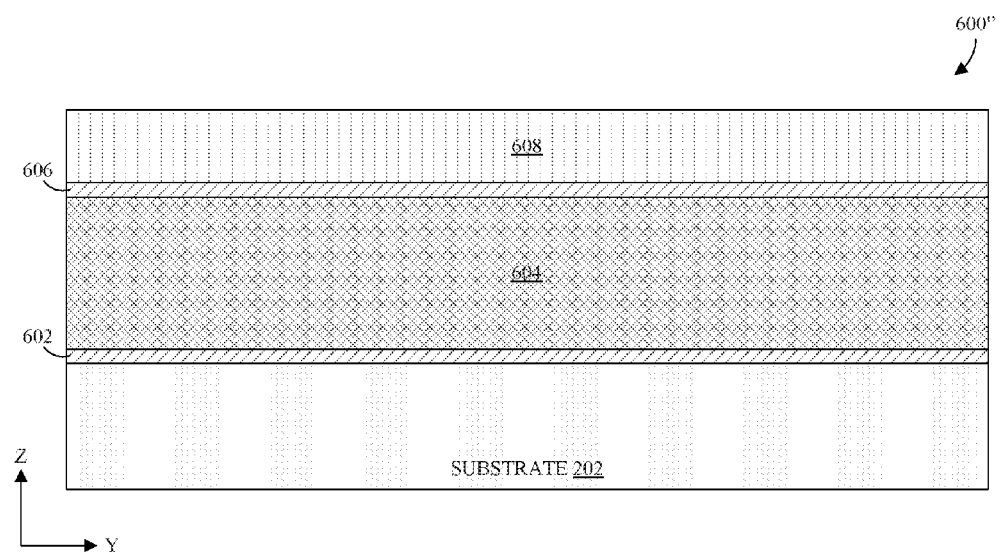

FIGS. 6A & B illustrate top and cross sectional views 600', 600", respectively, of some embodiments corresponding to Action 404. As shown by FIGS. 6A & B, a first dielectric layer 602, a first conductive layer 604, a second dielectric layer 606, and a hard mask layer 608 are stacked or formed in that order over a top surface of the semiconductor substrate 202. Each of the layers 602-608 typically has a uniform thickness. The first and second dielectric layers 602, 606 are, for example, an oxide, such as silicon dioxide. The first conductive layer 604 is, for example, polysilicon. The hard mask layer is 608, for example, a nitride or a multilayer nitride-oxide-nitride (NON) film.

Figure 7A:
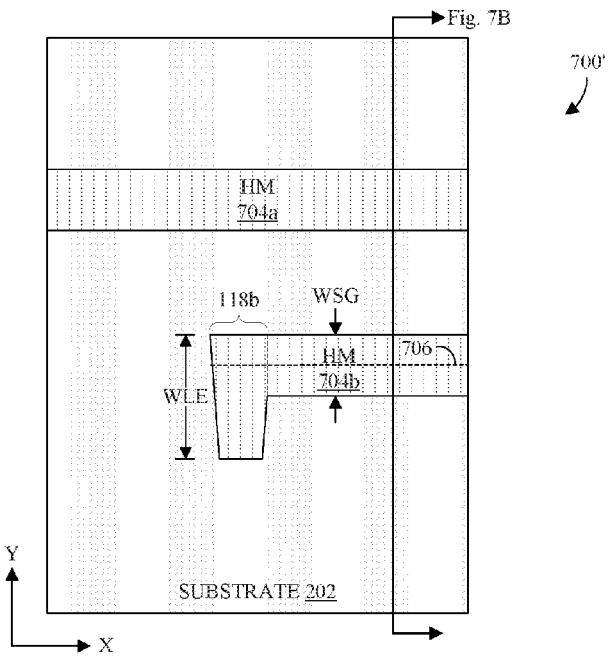
Figure 7B:
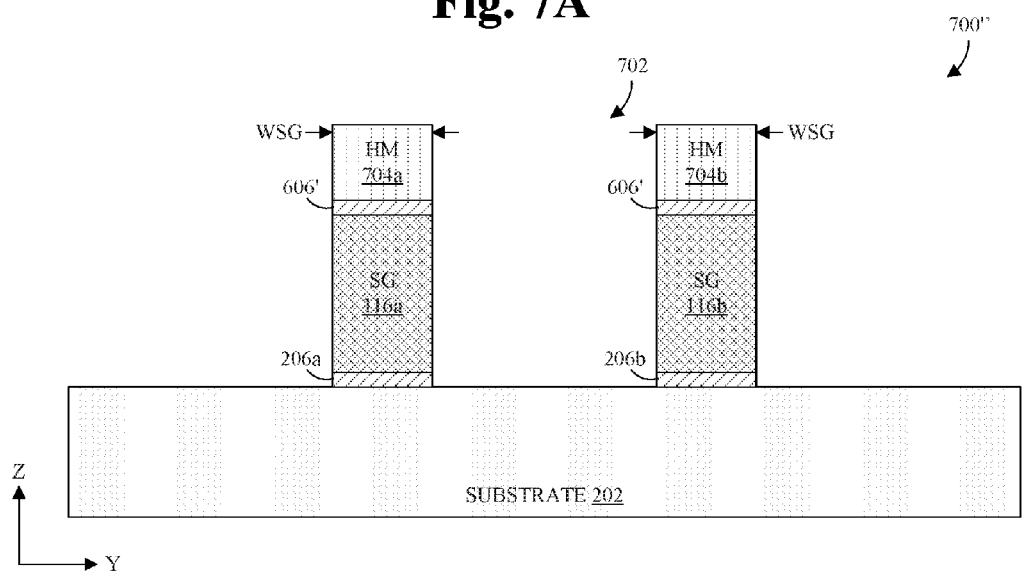

FIGS. 7A & B illustrate top and cross sectional views 700', 700", respectively, of some embodiments corresponding to Action 406. As shown by FIGS. 7A & B, a first etch is performed through the hard mask, second dielectric, first conductive, and first dielectric layers 602-608 to form a pair of spaced select gates 116a, 116b. In some embodiments, the select gates 116 are spaced about 110 nm from each other. The select gates 116 extend linearly in parallel with generally uniform widths WSG and terminate at asymmetric line ends 118b. In some embodiments, the select gates line ends 118 are staggered (i.e., not in line). A select gate line end 118 has an increased width WLE relative to the generally uniform width WSG. The generally uniform width WSG is, for example, about 70 nm, and the increased width WLE is, for example, about 70-160 nm. Further, a select gates line end 118 extends away from a central region 702 between the select gates 116, and is asymmetric about an axis 706 that runs along the length of the select gate 116 and that bisects the generally uniform width WSG of the select gate 116. In some embodiments, a select gate line end 118 has a width WLE of about 70-160 nm and/or a length of about 90 nm. Further, in some embodiments, the projection of a select gate line end 118 onto the top surface of the semiconductor substrate 202 is circular, triangular, rectangular, or trapezoidal.

The select gates 116 rest upon gate dielectrics 206a, 206b electrically isolating the select gates 116 from the semiconductor substrate 202. Further, the select gates 116 are masked by hard masks 704a, 704b electrically isolated from the select gates 116 by the remaining second dielectric layer 606'. Because the select gates 116, the hard masks 704, the remaining second dielectric 606', and the gate dielectrics 206b are formed together, the projections of the select gates 116, the hard masks 704, the remaining second dielectric 606', and the gate dielectrics 206b onto the top surface of the semiconductor substrate 202 are substantially the same. The projections may be identical, or can have slight variations due to sidewalls being slightly tapered, for example, due to an etch not being perfectly anisotropic (i.e., being not perfectly unidirectional).

Figure 8A:
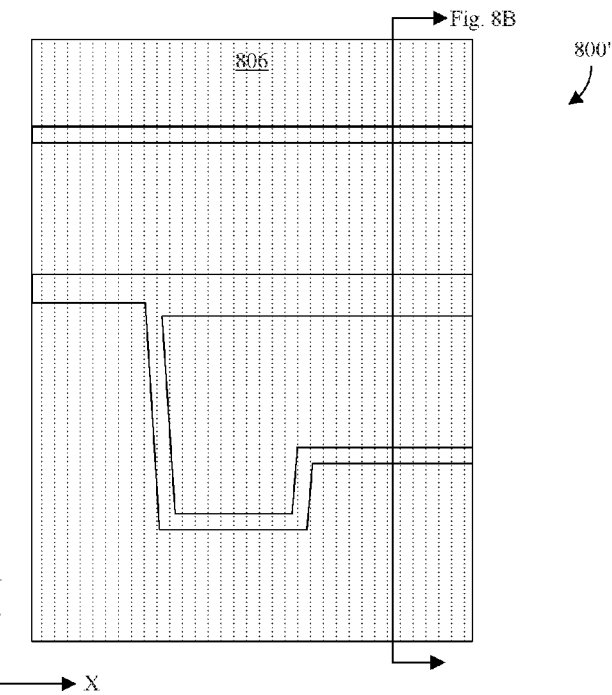
Figure 8B:
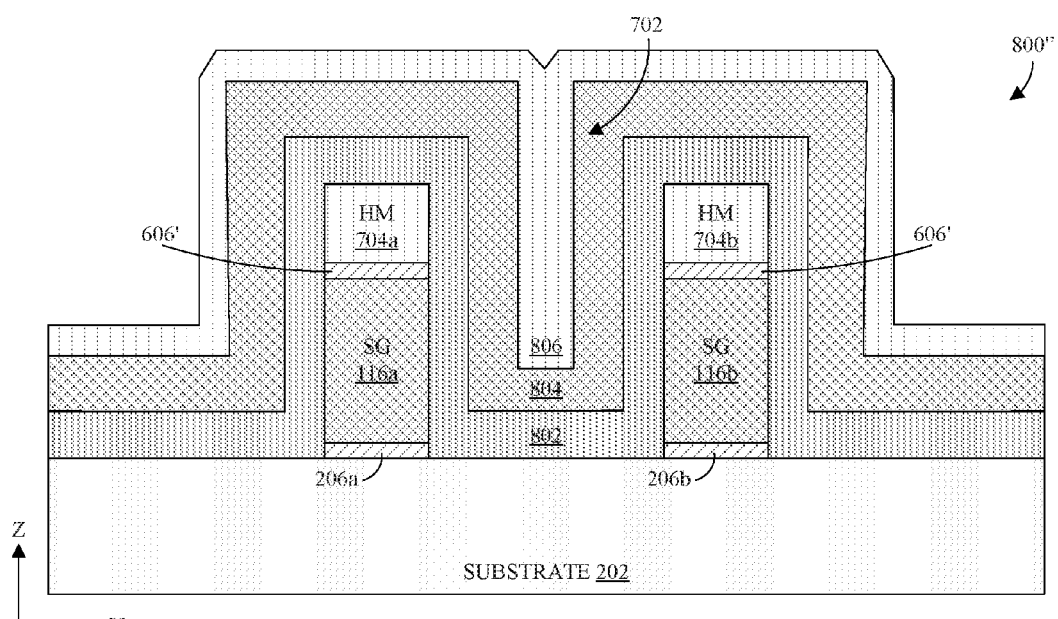

FIGS. 8A & B illustrate top and cross sectional views 800', 800", respectively, of some embodiments corresponding to Actions 408 and 410. As shown by FIGS. 8A & B, a third, charge trapping dielectric layer 802 is conformally formed over the semiconductor structure. The third dielectric layer 802 is conformally formed over the top surface of the semiconductor substrate 202 and the hard masks 704, and along sidewalls of the gate dielectrics 206, the select gates 116, the remaining second dielectric layer 606', and the hard masks 704. The third dielectric layer 802 is, for example, a multilayer charge trapping dielectric, such as an oxide-nitride-oxide (ONO) dielectric or an oxide-silicon dot-oxide (OSiO) dielectric. Also shown by FIGS. 8A & B, a second conductive layer 804 and a fourth dielectric layer 806 are stacked or formed in that order over the third, charge trapping dielectric layer 802. The second conductive layer 804 is conformally formed over the third dielectric layer 802, and the fourth dielectric layer 806 is conformally formed over the second conductive layer 804. The second conductive layer 804 is, for example, polysilicon, and the fourth dielectric layer 806 is, for example, silicon nitride.

Figure 9A:
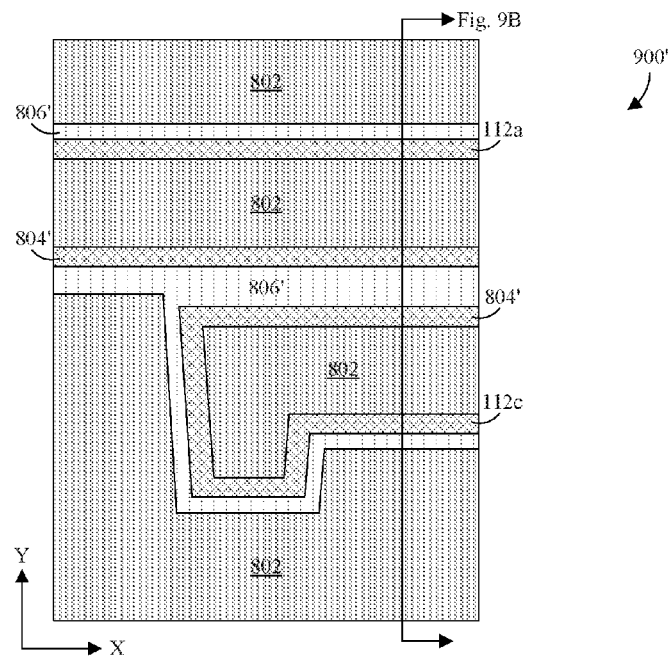
Figure 9B:
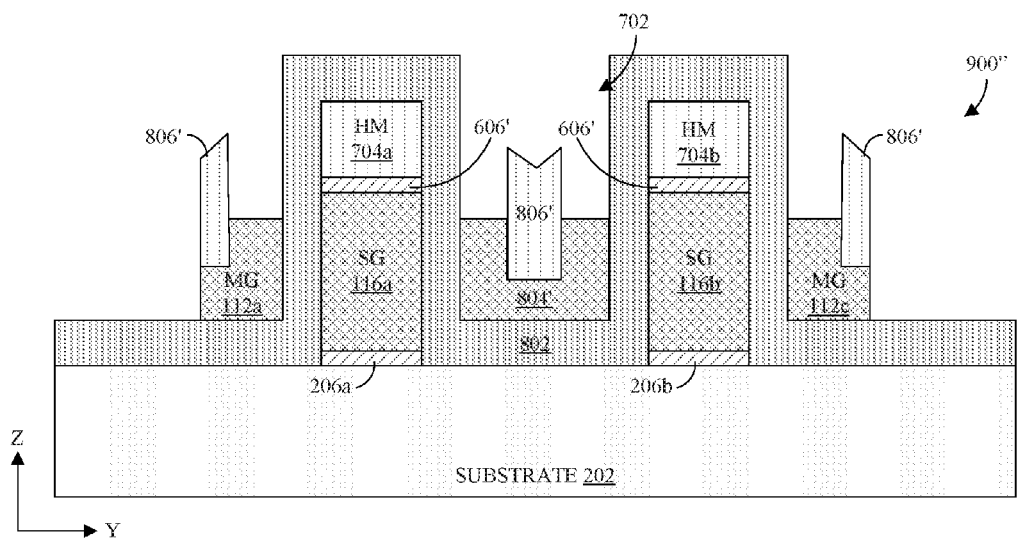

FIGS. 9A & B illustrate top and cross sectional views 900', 900", respectively, of some embodiments corresponding to Action 412. As shown by FIGS. 9A & B, a second etch is performed through the second conductive layer 804 and the fourth dielectric layer 806 to form a pair of memory gates 112a, 112c over and laterally abutting the third dielectric layer 802. In some embodiments, the second etch includes multiple individual etches of the second conductive layer 804 and/or the fourth dielectric layer 806.

Figure 10A:
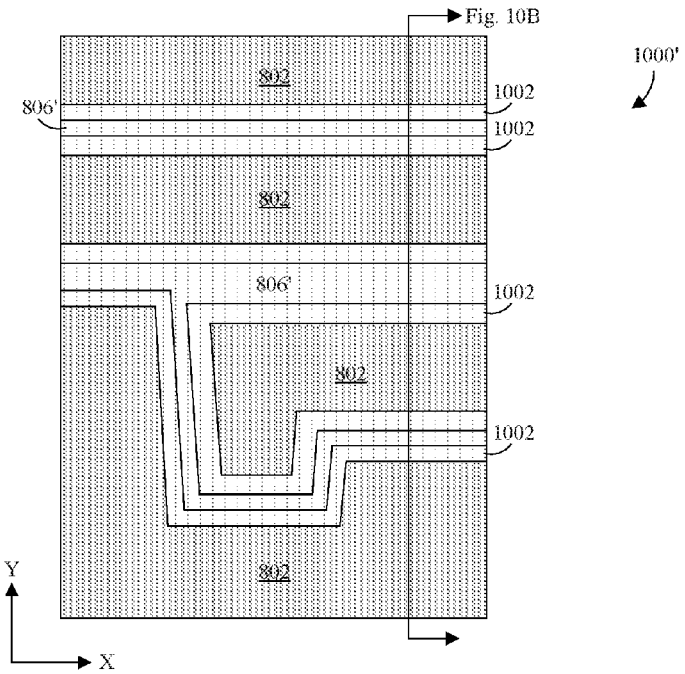
Figure 10B:
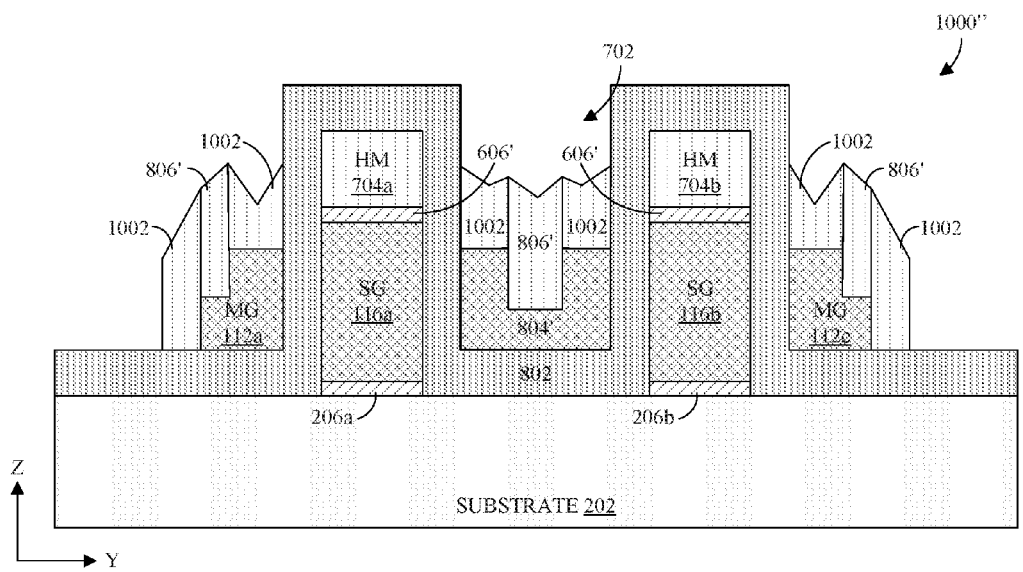

FIGS. 10A & B illustrate top and cross sectional views 1000', 1000", respectively, of some embodiments corresponding to Action 414. As shown by FIGS. 10A & B, a fifth dielectric layer 1002 is formed to seal or otherwise cover uncovered surfaces of the memory gates 112. For example, an intermediate dielectric layer can be deposited and selectively etched to form the fifth dielectric layer 1002. The sixth dielectric layer 1002 is, for example, silicon nitride.

Figure 11A:
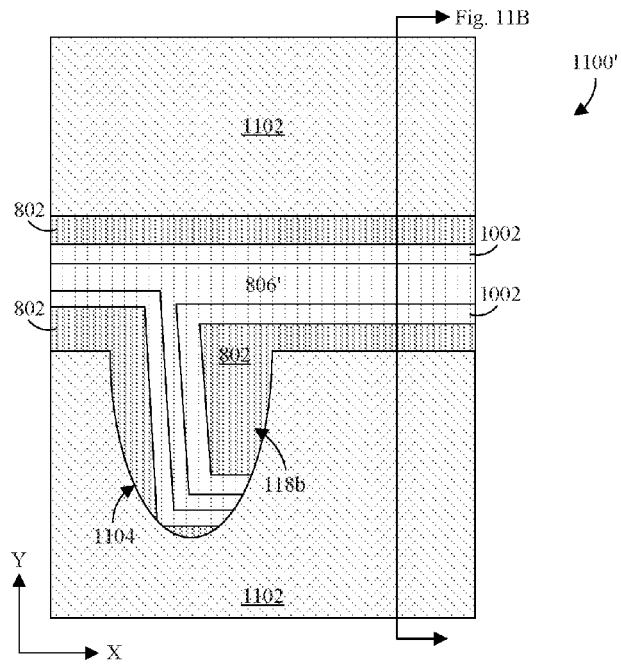
Figure 11B:
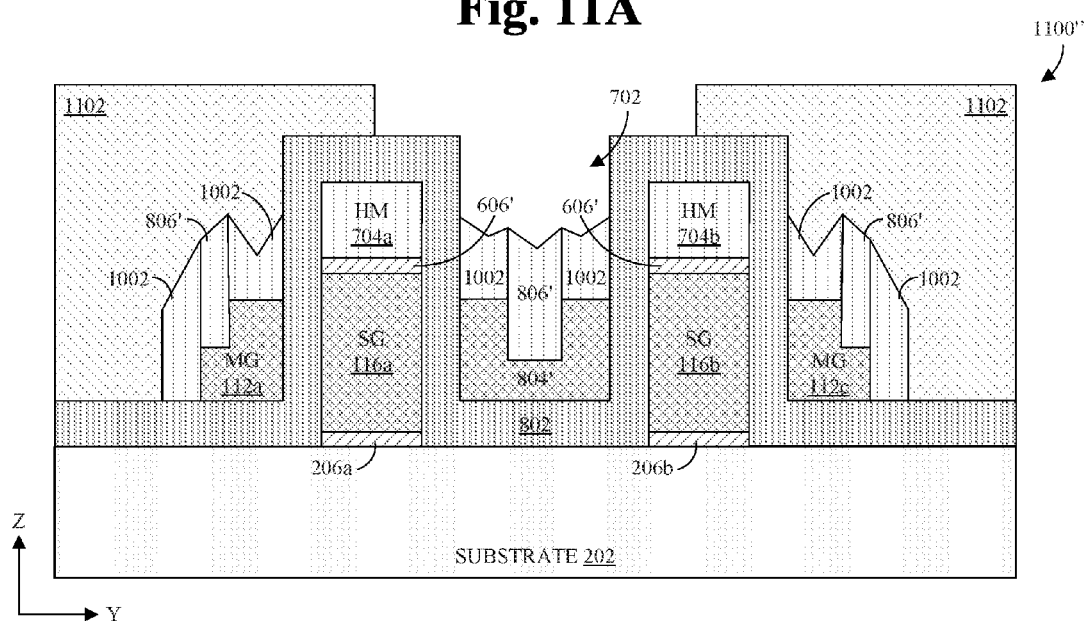
Figure 12A:
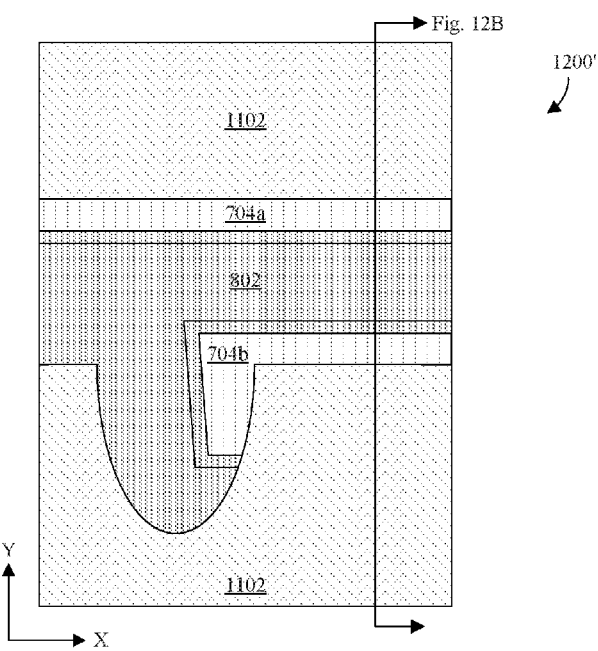
Figure 12B:
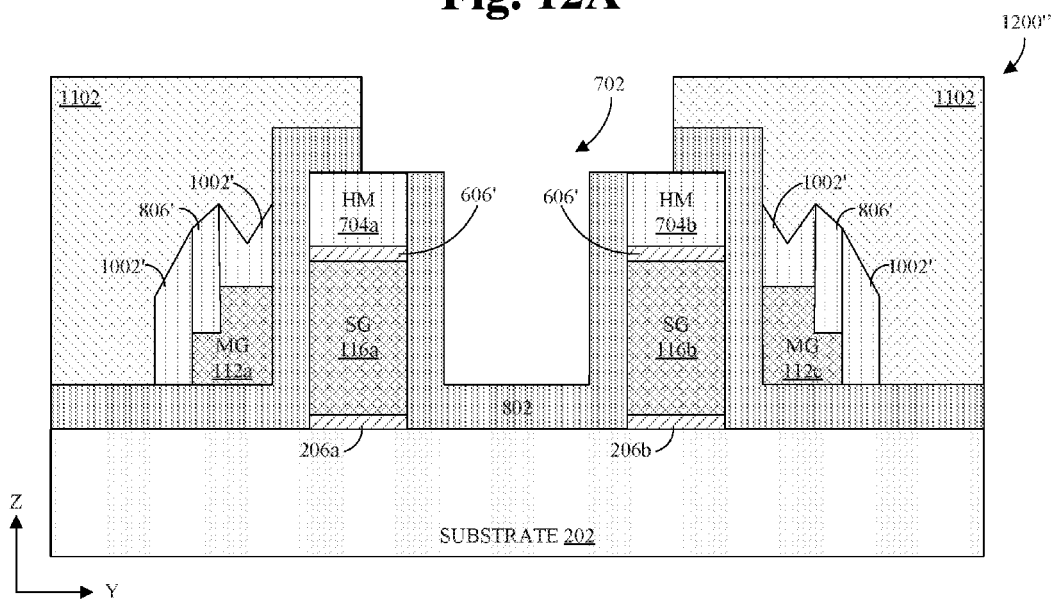
Figure 13A:
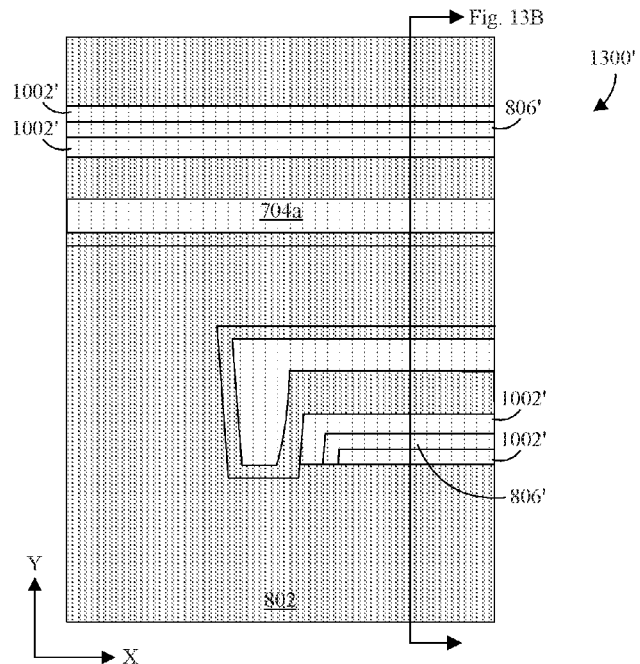
Figure 13B:
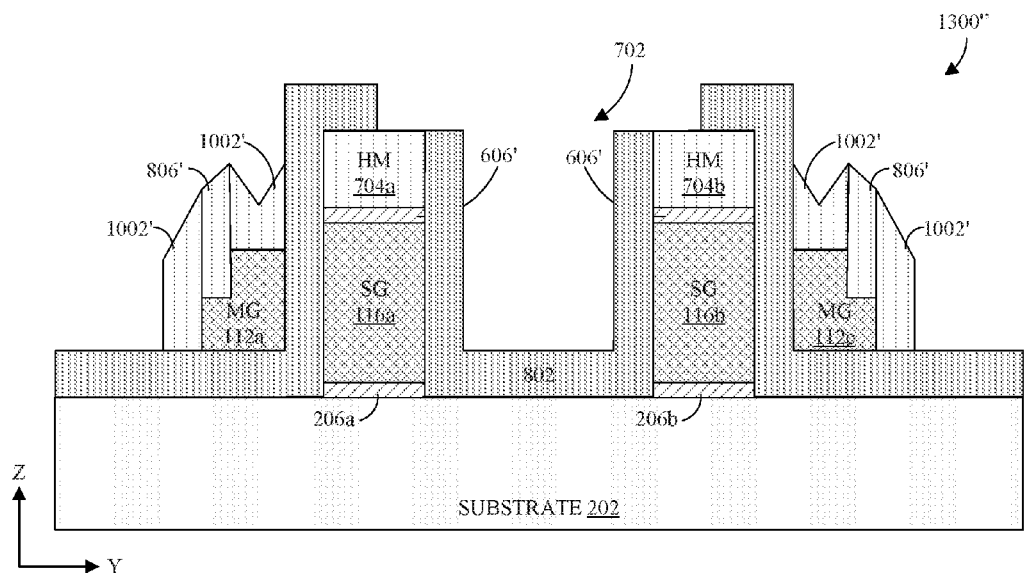

FIGS. 11-13 illustrate top and cross sectional views 1100', 1100", 1200', 1200", 1300', 1300", respectively, of some embodiments corresponding to Action 416. As shown by FIGS. 11A & B, a mask 1102 is formed that masks portions of the remaining second conductive layer 804', the remaining fourth dielectric layer 806', and the sixth dielectric layer 1002 outside the central region 702. In other words, peripheral regions (i.e., those regions outside the central region 702) of the semiconductor structure are masked. In some embodiments, the mask 1102 includes lateral recesses 1104 exposing portions of the hard masks 704 overlaying the select gate line ends 118. Further, in some embodiments, the mask 1102 leaves portions of the remaining second conductive layer 804', the remaining fourth dielectric layer 806', and the sixth dielectric layer 1002 outside the central region 702 and extending around the periphery of the select gate line end 118 unmasked, except about a 10-50 nm stretch abutting the memory gates 112. The mask 1102 is, for example, a photoresist and is formed by, for example, photolithography. As shown by FIGS. 12A & B, a third, isotropic etch is performed through portions of the remaining second conductive layer 804', the remaining fourth dielectric layer 806', and the sixth dielectric layer 1002 in accordance with the mask 1102. The third etch is typically performed using CDE. In some embodiments, the plasma for the third etch is generated through application of a frequency of about 2.45 gigahertz (GHz) to an etch gas comprised of $C_xH_yF_z$ and $O_2$, where x, y and z are variables. The ratio of $C_xH_yF_z$ to $O_2$ is, for example, about 0.5 to about 1.5, and $C_xH_yF_z$ is, for example, $CF_4$, $CH_2F_2$ or $CHF_3$. The plasma is then applied to the semiconductor structure with a chamber pressure of about 200 to 700 millitorr (mT) and a flow rate of about 300 to 800 standard cubic centimeters per minute (sccm). The foregoing results in selectivities of about 5 to 10 for silicon/oxide and nitride/oxide. As shown by FIGS. 13A & B, the mask 1102 is removed by, for example, plasma ashing.

Because the third etch is isotropic, the third etch moves vertically as well as laterally. During the third etch, the third etch begins at the unmasked portions of the remaining second conductive layer 804', the remaining fourth dielectric layer 806', and the sixth dielectric layer 1002. Over the course of the etch, the etch moves laterally under the mask around the periphery of the line ends 118 of the select gates 116 towards the memory gates 112. If the etch reaches channel regions (not shown) of the memory gates 112 and the select gates 116, damage can occur to the memory gates 112. Hence, it's advantageous that the select gate line ends 118 are greater in size than other select gate line ends. The larger size of the select gate line ends 118 increases the length of the path that the third etch takes to the channel regions.

Figure 14A:
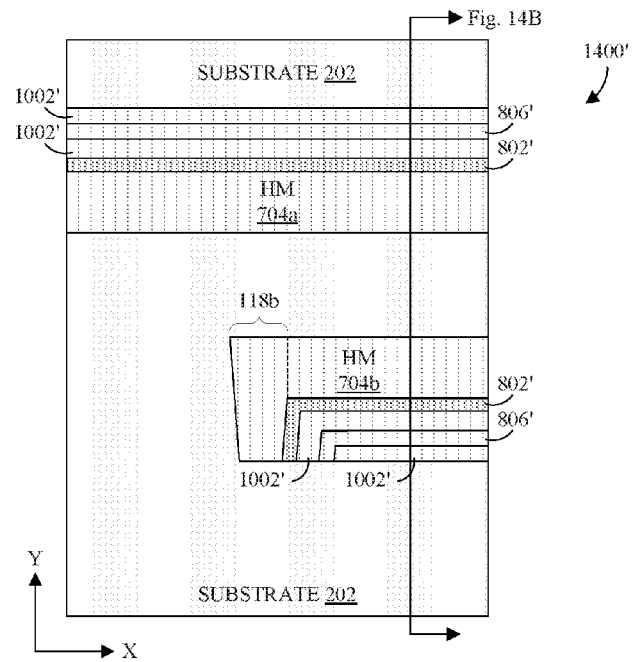
Figure 14B:
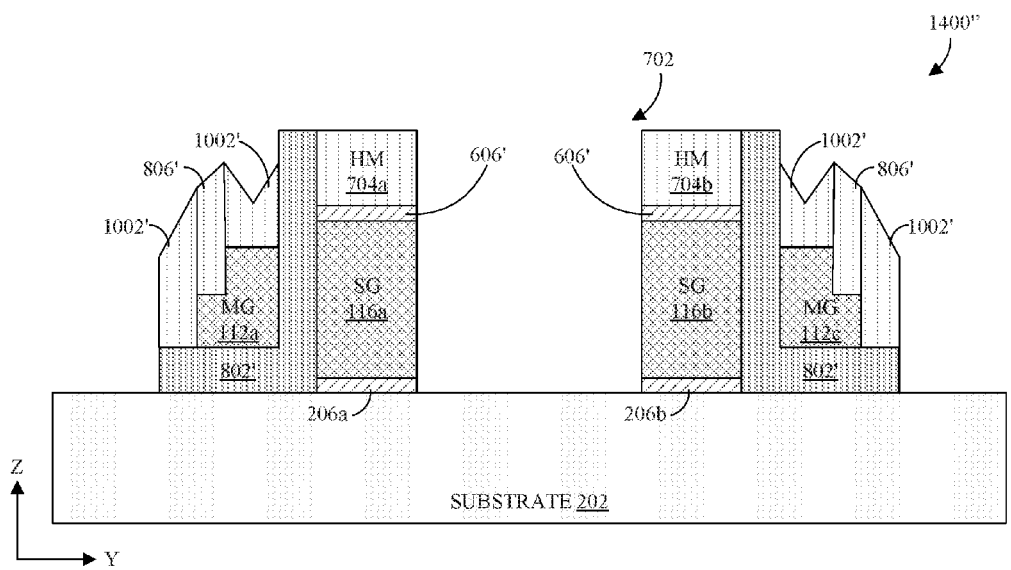

FIGS. 14A & B illustrate top and cross sectional views 1400', 1400", respectively, of some embodiments corresponding to Action 418. As shown by FIGS. 14A & B, a fourth etch is performed through the third dielectric layer 802 to remove uncovered, horizontal portions of the third dielectric layer 802. In some embodiments, the uncovered portions of the third dielectric layer 802 include portions covering the hard masks 704. The fourth etch can, for example, be a fully dry etch, a fully wet etch, or a combination wet and dry etch.

Figure 15A:
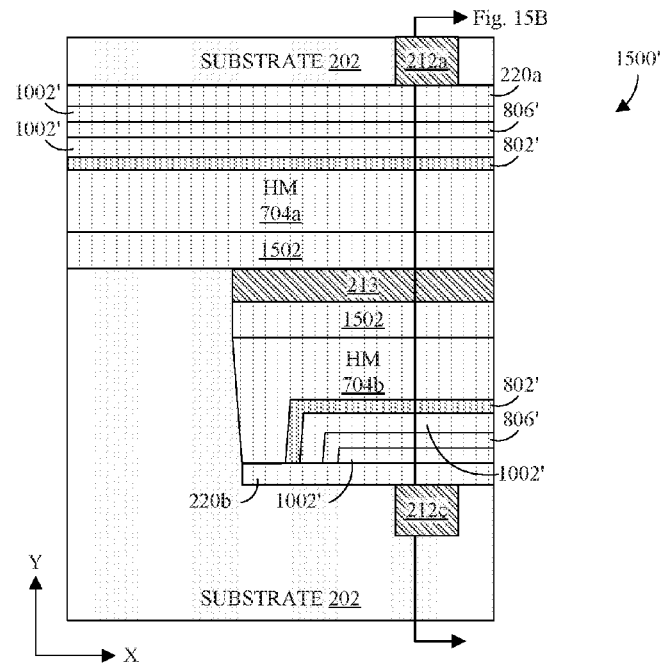
Figure 15B:
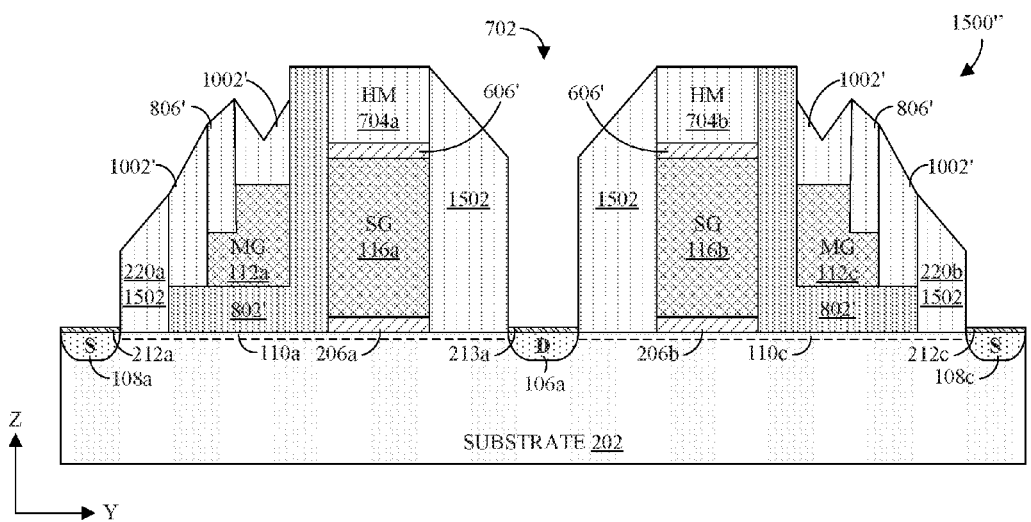

FIGS. 15A & B illustrate top and cross sectional views 1500', 1500", respectively, of some embodiments corresponding to Actions 420-424. As shown by FIGS. 15A & B, a sixth dielectric layer 1502 is formed along sidewalls of the select gates 116 in the central region 702, and along sidewalls of the remaining third and fifth dielectric layer 802', 1002' outside the central region 702. For example, an intermediate dielectric layer can be formed and selectively etched to form the sixth dielectric layer 1502. The portions of the sixth dielectric layer 1502 lining sidewalls outside the central region 702 form peripheral sidewall structures 220a, 220b. The sixth dielectric layer 1502 is, for example, silicon nitride. Also shown by FIGS. 15A & B, source and drain regions 106a, 108a, 108c are embedded within the semiconductor substrate 202 to form channel regions 110a, 110c, and a silicide layer is formed over the source and drain regions 106, 108 to form contact pads 212a, 212c, 213. In some embodiments, one of the line ends 118 of the pair of select gates 116 is spaced about 100-200 nm, typically about 200 nm, from the corresponding channel regions 110, while the other line end 118 is spaced more from the corresponding channel region 110. The silicide layer is, for example, nickel silicide.

Figure 16A:
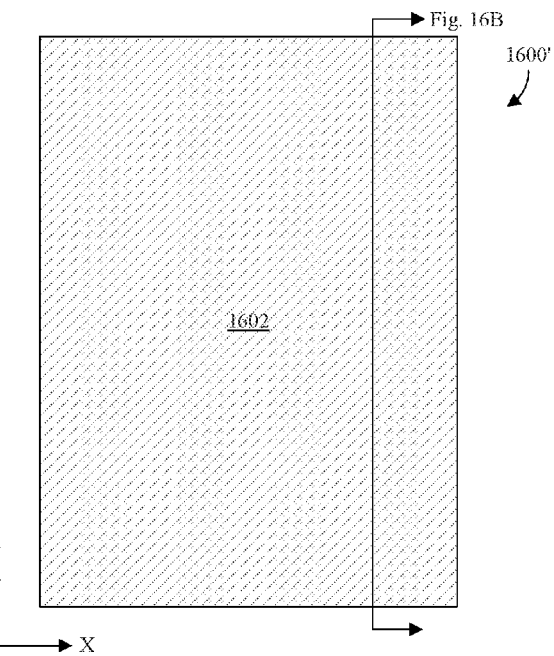
Figure 16B:
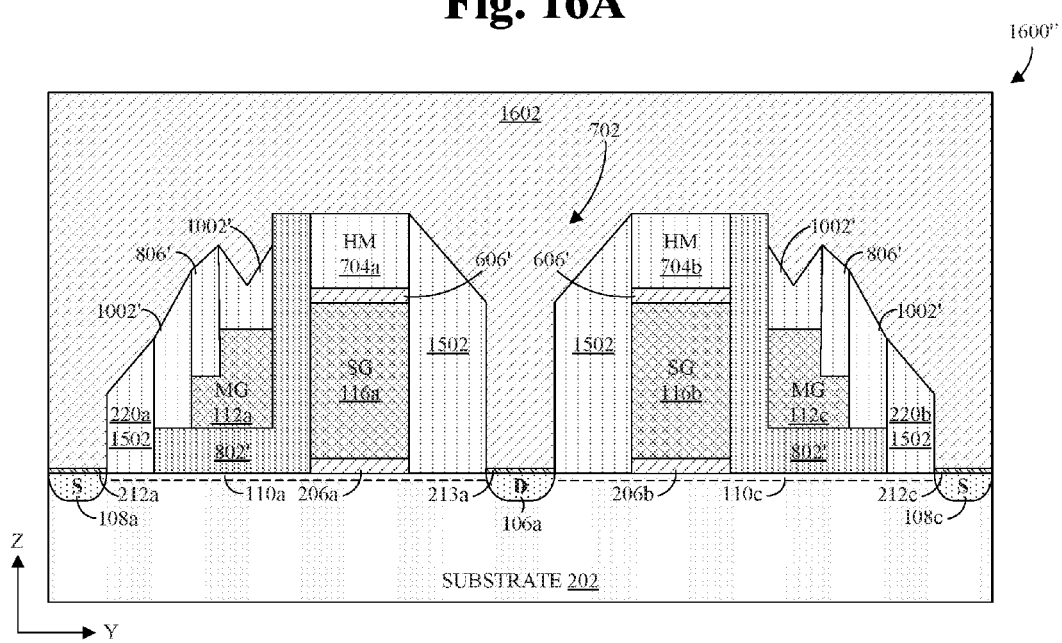

FIGS. 16A & B illustrate top and cross sectional views 1600', 1600", respectively, of some embodiments corresponding to Action 426. As shown by FIGS. 16A & B, a seventh, interlayer dielectric layer 1602 is formed that encapsulates the semiconductor structure. The seventh dielectric layer 1602 is, for example, an oxide, such as silicon dioxide.

Figure 17A:
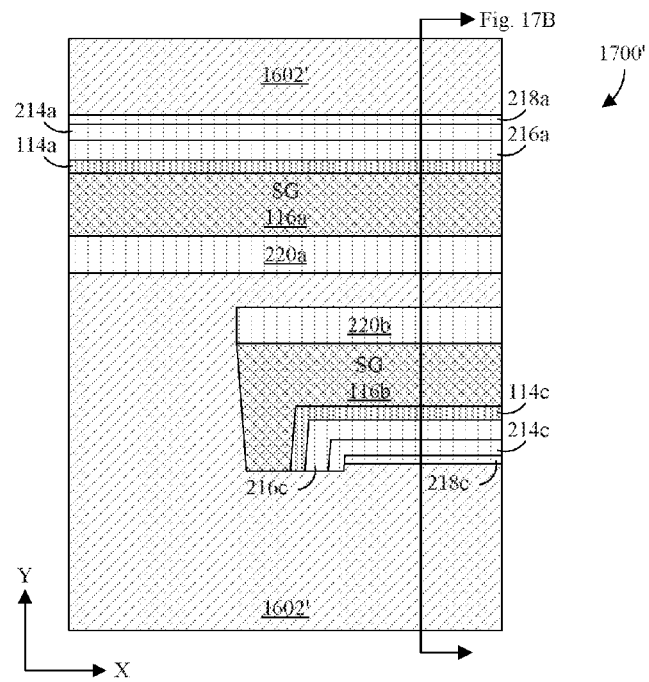
Figure 17B:
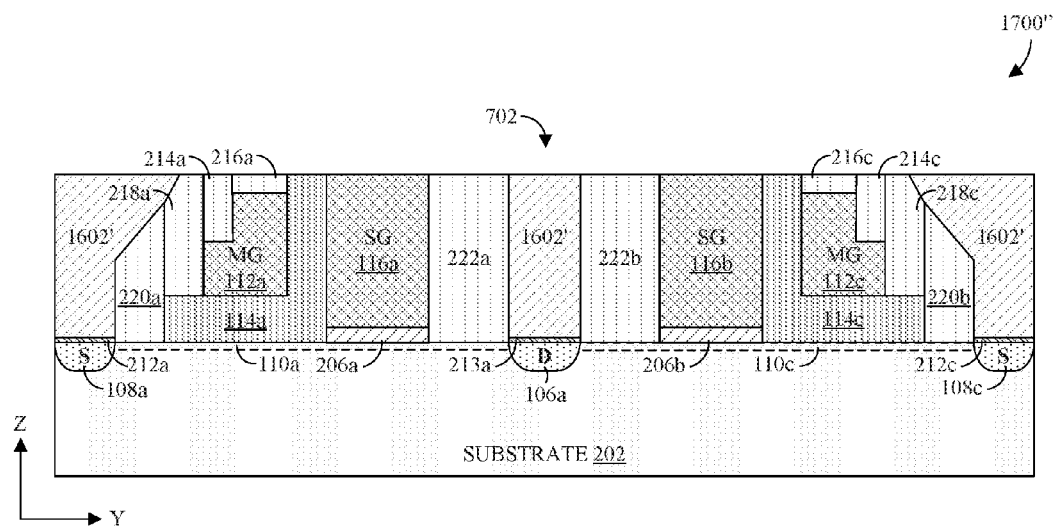

FIGS. 17A & B illustrate top and cross sectional views 1700', 1700", respectively, of some embodiments corresponding to Action 428. As shown by FIGS. 17A & B, a planarization is performed to the select gates 122 through the sixth and seventh dielectric layers 1502, 1602, and the hard masks 704, the remaining second, third, fourth and fifth dielectric layers 606', 802', 806', 1002'. The planarization results in the formation of central sidewall structures 222a, 222b within the central region 702. The planarization further results in top sealers 216a, 216c sealing corresponding top surfaces of the memory gates 112, side sealers 218a, 218c sealing corresponding lower sidewalls of the memory gates 112, and spacers 214a, 214c spacing lower, outer sidewalls and upper, inner sidewalls of corresponding memory gates 112. The second planarization can, for example, be performed using a CMP.

FIG. 2B illustrates a cross-sectional view 200" of some embodiments corresponding to Actions 430 and 432. As shown by FIG. 1, an eighth, interlayer dielectric is formed over the top surface of the semiconductor structure and conductive contacts 210a, 210c are formed extending vertically down through the remaining seventh dielectric layer 1602' and the eighth dielectric layer (collectively an interlayer dielectric 208) to the contact pads 212, 213.

Thus, as can be appreciated from above, the present disclosure provides a semiconductor structure of a split gate flash memory cell. The semiconductor structure includes a semiconductor substrate including a first source/drain region and a second source/drain region. A channel region is arranged between the first and second source/drain regions. The semiconductor structure further includes a select gate and a memory gate spaced between the first and second source/drain regions over the channel region. The select gate extends over the channel region and terminates at a line end having a top surface asymmetric about an axis that extends along a length of the select gate and that bisects a width of the select gate. The semiconductor structure also includes a charge trapping dielectric arranged between neighboring sidewalls of the memory gate and the select gate, and arranged under the memory gate.

In other embodiments, the present disclosure provides a method of manufacturing a semiconductor structure of a pair of split gate flash memory cells. The method includes forming a pair of select gates that extend to corresponding line ends over a semiconductor substrate and with generally uniform widths. The corresponding line ends have top surfaces asymmetric about corresponding axes that extend along lengths of the corresponding select gates and that bisect the generally uniform widths of the corresponding select gates. The method further includes forming a charge trapping dielectric layer conformally along sidewalls of the select gates and the line ends, and over top surfaces of the select gates and the semiconductor substrate. Even more, the method includes forming a pair of memory gates corresponding to the pair of select gates over and laterally abutting the charge trapping dielectric layer.

In yet other embodiments, the present disclosure provides a semiconductor structure of split gate flash memory cells. The semiconductor structure includes a semiconductor substrate including channel regions arranged in rows and columns between source and drain regions. The semiconductor structure further includes select gates individual to the rows and extending across and perpendicular to the channel regions of corresponding rows. The select gates terminate at corresponding line ends having top surfaces asymmetric about corresponding axes that extend along lengths of the corresponding select gates and that bisect widths of the corresponding select gates. The semiconductor structure further includes memory gates corresponding to the select gates and spaced from the corresponding select gates between corresponding channel regions. Even more, the semiconductor structure includes charge trapping dielectrics corresponding to the memory gates that are arranged between the corresponding memory gates and the select gates, and that are arranged under the corresponding memory gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a semiconductor substrate including a pair of source/drain regions laterally spaced along a first axis; and
   a pair of gates arranged over the semiconductor substrate between the source/drain regions and laterally spaced along the first axis, wherein the pair of gates comprises a first gate and a second gate, wherein the first gate extends laterally along a second axis that is normal to the first axis and terminates at a line end, and wherein the line end is asymmetric about the second axis.

2. The semiconductor structure according to claim 1, further comprising:
   a charge trapping dielectric structure arranged between neighboring sidewalls of the first and second gates, and arranged under the second gate.

3. The semiconductor structure according to claim 1, wherein the first gate has a substantially uniform width while extending to the line end, and wherein the second axis bisects the substantially uniform width.

4. The semiconductor structure according to claim 1, wherein the line end extends laterally between opposing sidewalls, along a third axis that is parallel to the first axis, wherein one of the opposing sidewalls extends along a length of the first gate, and wherein another one of the opposing sidewalls is confined to the line end.

5. The semiconductor structure according to claim 1, wherein the line end extends laterally towards the second gate, along a third axis that is parallel to the first axis.

6. The semiconductor structure according to claim 1, wherein a projection of the line end onto a top surface of the semiconductor substrate is one of circular, triangular, rectangular, square, and trapezoidal.

7. The semiconductor structure according to claim 1, wherein the line end wraps around the second gate and has a distal point that is even with or past a sidewall of the second gate.

8. The semiconductor structure according to claim 1, wherein the semiconductor substrate comprises an additional source/drain region laterally spaced from one of the source/drain regions along the first axis, and wherein the semiconductor structure further comprises:
   a third gate and a fourth gate arranged over the semiconductor substrate and laterally spaced along the first axis, wherein the third and fourth gates are arranged between the additional source/drain region and the one of the source/drain regions, wherein the third gate extends laterally along a third axis that is normal to the first axis and that is parallel to the second axis, and wherein the third gate terminates at a second line end that is asymmetric about the third axis and that protrudes away from the first gate.

9. A semiconductor structure comprising:
   a semiconductor substrate including a pair of source/drain regions laterally spaced along a first axis;
   a pair of gates arranged over the semiconductor substrate between the source/drain regions and laterally spaced along the first axis, wherein the pair of gates comprises a first gate and a second gate, wherein the first gate extends laterally along a second axis that crosses the first axis and terminates at a line end, and wherein the line end is asymmetric about the second axis; and
   a charge trapping dielectric structure arranged between and contacting neighboring sidewalls of the first and second gates, wherein the charge trapping dielectric structure is further arranged under the second gate.

10. The semiconductor structure according to claim 9, wherein the second axis crosses the first axis substantially perpendicular to the first axis.

11. The semiconductor structure according to claim 9, wherein the first gate has a substantially uniform width while extending to the line end, and wherein the second axis is arranged at a midpoint of the substantially uniform width.

12. The semiconductor structure according to claim 9, wherein the line end extends laterally between opposing sidewalls of the first gate, along a third axis that is substantially parallel to the first axis, wherein one of the opposing sidewalls extends along a length of the first gate, and wherein another one of the opposing sidewalls is confined to the line end.

13. The semiconductor structure according to claim 9, wherein the line end extends laterally towards the second gate, along a third axis that is substantially parallel to the first axis.

14. The semiconductor structure according to claim 9, wherein the line end wraps around the second gate and has a distal point that is even with or past a sidewall of the second gate.

15. The semiconductor structure according to claim 9, further comprising:
    a memory cell arranged over the semiconductor substrate and comprising the pair of gates and the charge trapping dielectric structure.

16. The semiconductor structure according to claim 15, further comprising:
    a second memory cell arranged over the semiconductor substrate, laterally adjacent to the memory cell, wherein the second memory cell comprises a third gate and a fourth gate laterally spaced along the first axis, wherein the third gate extends laterally along a third axis that crosses the first axis and terminates at a second line end that is asymmetric about the third axis and that protrudes away from the first and second gates.

17. The semiconductor structure according to claim 16, wherein the second line end is laterally offset from the line end along the third axis.

18. A semiconductor structure comprising:
    a semiconductor substrate including a pair of first source/drain regions laterally spaced along a first axis, and further including a pair of second source/drain regions laterally spaced along the first axis, wherein the pair of first source/drain regions shares a source/drain region with the pair of second source/drain regions;

a first pair of gates arranged over the semiconductor substrate between the first source/drain regions and laterally spaced along the first axis, wherein the first pair of gates comprises a first gate and a second gate, wherein the first gate extends laterally along a second axis that crosses the first axis and terminates at a first line end, and wherein the first line end is asymmetric about the second axis; and a second pair of gates arranged over the semiconductor substrate between the second source/drain regions and laterally spaced along the first axis, wherein the second pair of gates comprises a third gate and a fourth gate, wherein the third gate extends laterally along a third axis that crosses the first axis and terminates at a second line end, and wherein the second line end is asymmetric about the third axis.

19. The semiconductor structure according to claim 18, wherein the second gate and the third gate are respectively on opposite sides of the first gate.

20. The semiconductor structure according to claim 18, wherein the first and second line ends are laterally offset along the second axis.

* * * * *